United States Patent
Yoshida et al.

(10) Patent No.: US 10,974,181 B2
(45) Date of Patent: Apr. 13, 2021

(54) FILTER UNIT PRETREATMENT METHOD, TREATMENT LIQUID SUPPLY APPARATUS, FILTER UNIT HEATING APPARATUS, AND TREATMENT LIQUID SUPPLY PASSAGE PRETREATMENT METHOD

(71) Applicant: Tokyo Electron Limited, Tokyo (JP)

(72) Inventors: Yuichi Yoshida, Koshi (JP); Ryouichirou Naitou, Koshi (JP); Arnaud Alain Jean Dauendorffer, Koshi (JP); Koji Takayanagi, Koshi (JP); Shinobu Miyazaki, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/580,292

(22) Filed: Sep. 24, 2019

(65) Prior Publication Data
US 2020/0016521 A1   Jan. 16, 2020

Related U.S. Application Data

(62) Division of application No. 15/025,045, filed as application No. PCT/JP2014/075692 on Sep. 26, 2014, now Pat. No. 10,493,387.

(30) Foreign Application Priority Data

Sep. 27, 2013 (JP) ................................. 2013-201867
Feb. 5, 2014 (JP) ................................. 2014-020640

(51) Int. Cl.
  *B01D 37/02*   (2006.01)
  *H01L 21/67*   (2006.01)
  *B01D 35/18*   (2006.01)

(52) U.S. Cl.
  CPC .............. *B01D 37/02* (2013.01); *B01D 35/18* (2013.01); *H01L 21/67017* (2013.01)

(58) Field of Classification Search
  CPC combination set(s) only.
  See application file for complete search history.

(56) References Cited

U.S. PATENT DOCUMENTS

| 6,861,371 | B2 | 3/2005 | Kamikawa et al. |
| 2003/0034056 | A1* | 2/2003 | Amai ............ B08B 3/04 134/93 |

(Continued)

FOREIGN PATENT DOCUMENTS

| JP | H10-172881 A1 | 6/1998 |
| JP | 2003-053244 A1 | 2/2003 |

(Continued)

OTHER PUBLICATIONS

International Search Report and Written Opinion (Application No. PCT/JP2014/075692) dated Jan. 6, 2015.

(Continued)

*Primary Examiner* — Mikhail Kornakov
*Assistant Examiner* — Natasha N Campbell
(74) *Attorney, Agent, or Firm* — Burr & Brown, PLLC

(57) ABSTRACT

In one embodiment, after a new filter unit is installed in a treatment liquid supply apparatus, there is performed, before a solvent-containing treatment liquid is passed through the filter unit, a step of soaking the filter unit with a solvent for pretreatment and then discharging therefrom the solvent. The solubility of a material, constituting a filter part of the filter unit, to the solvent is greater than the solubility of the material to the treatment liquid. This step makes it possible to remove a component, which may elute from the filter part into the treatment liquid to produce foreign matters (particles), before treatment liquid is passed through the filter unit.

7 Claims, 15 Drawing Sheets

(56) References Cited

U.S. PATENT DOCUMENTS

| | | |
|---|---|---|
| 2003/0084929 A1 | 5/2003 | Kamikawa et al. |
| 2005/0158977 A1* | 7/2005 | Yeo .................. H01L 21/28562 |
| | | 438/608 |
| 2006/0014098 A1 | 1/2006 | Hada et al. |
| 2013/0319957 A1 | 12/2013 | Sugawara et al. |
| 2014/0131293 A1 | 5/2014 | Mesawich et al. |
| 2015/0000517 A1 | 1/2015 | Yoshihara et al. |

FOREIGN PATENT DOCUMENTS

| | | |
|---|---|---|
| JP | 2010-167384 A1 | 8/2010 |
| JP | 2013-030690 A1 | 2/2013 |
| WO | 2012/111139 A1 | 8/2012 |
| WO | 2013/129252 A1 | 9/2013 |

OTHER PUBLICATIONS

International Preliminary Report on Patentability (Application No. PCT/JP2014/075692) dated Apr. 7, 2016.
Japanese Office Action (Application No. 2016-173083) dated Aug. 22, 2017 (with English translation).

* cited by examiner

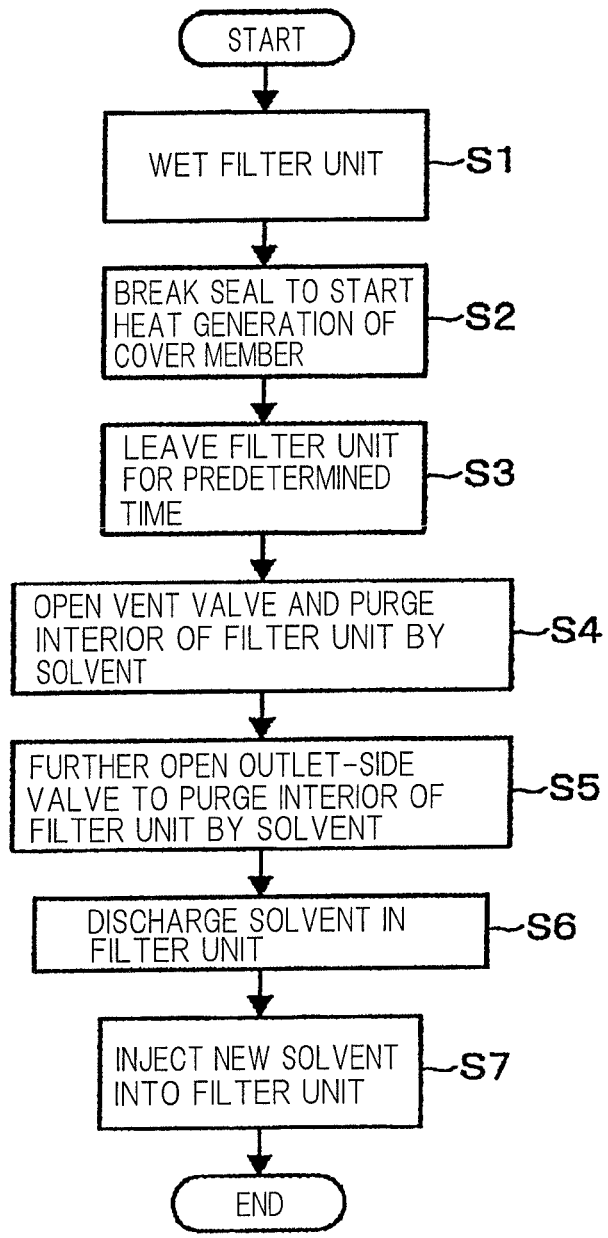
F I G. 4

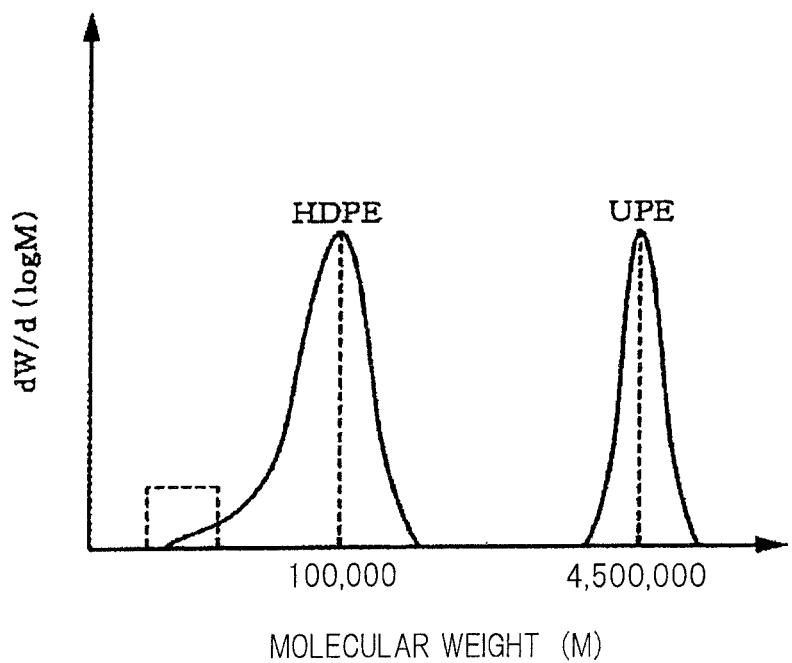
F I G. 5
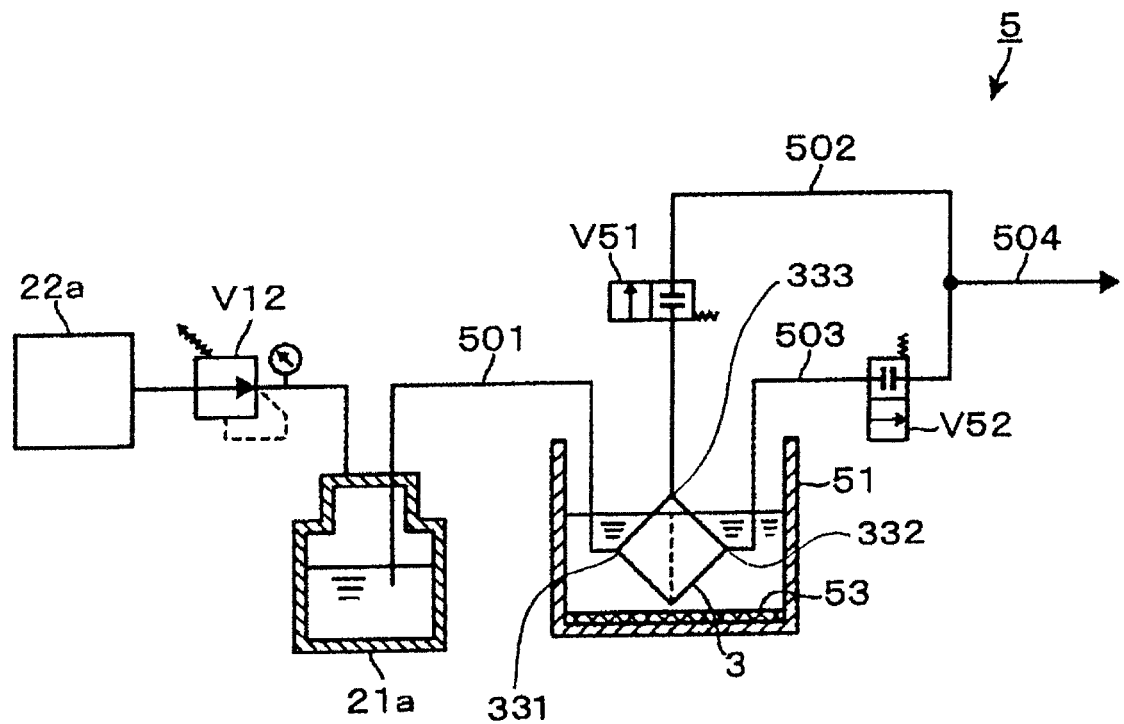
F I G. 6

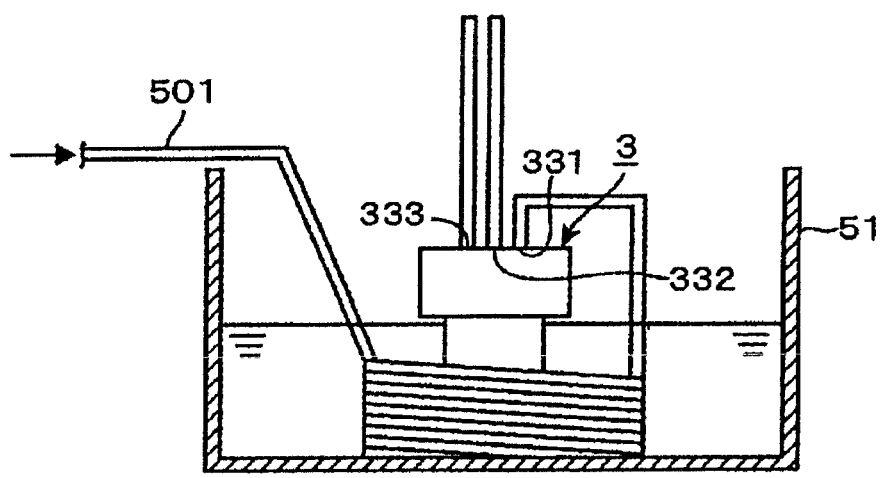
F I G. 8

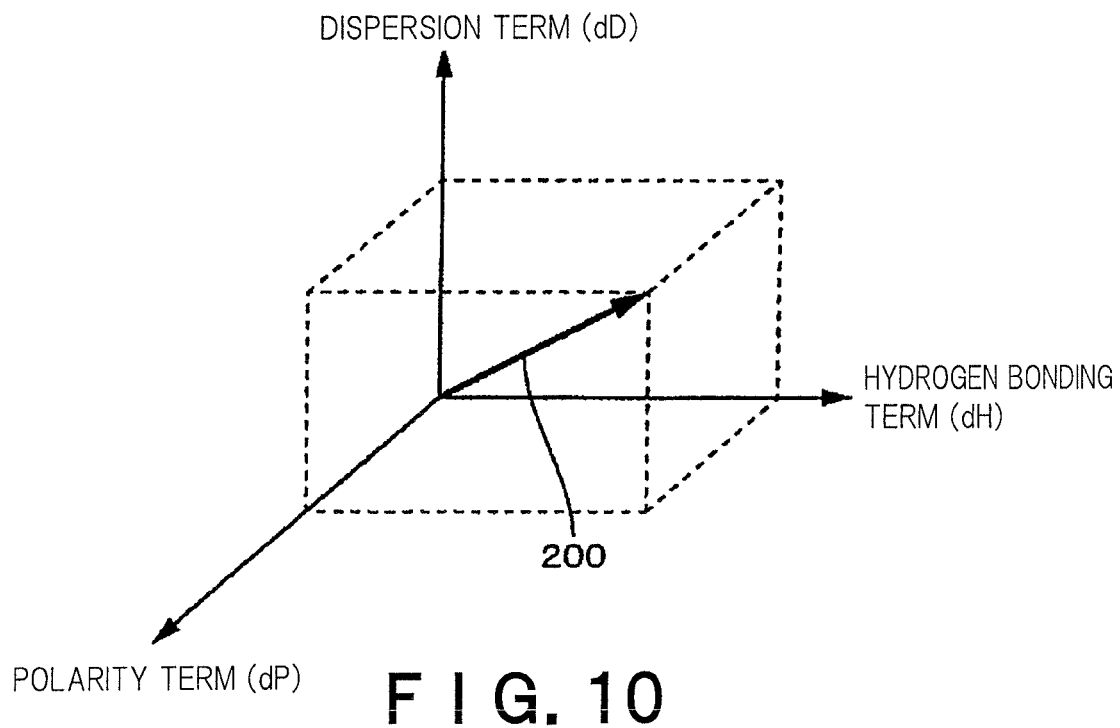
F I G. 10
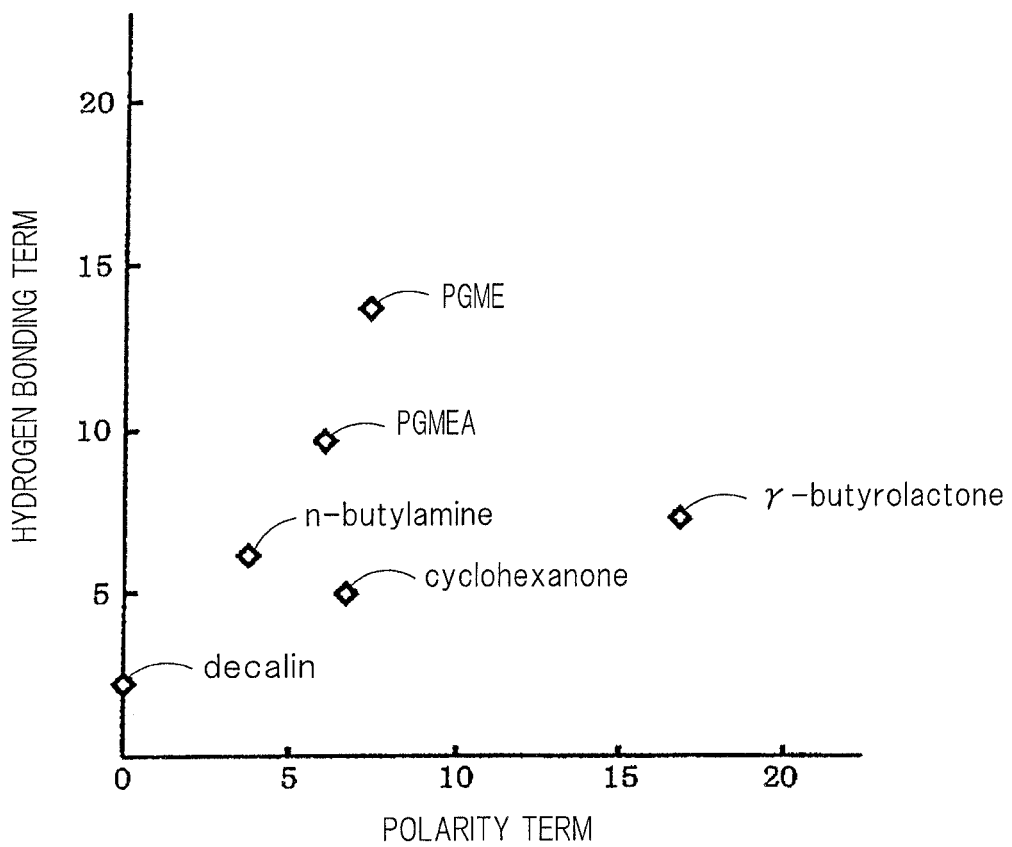
F I G. 11

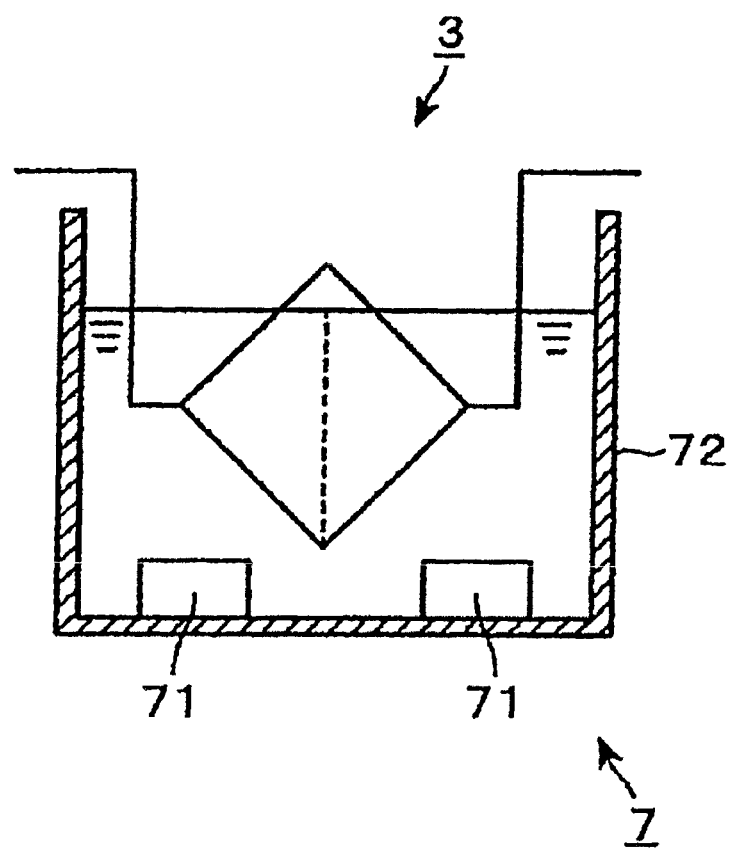
F I G. 12

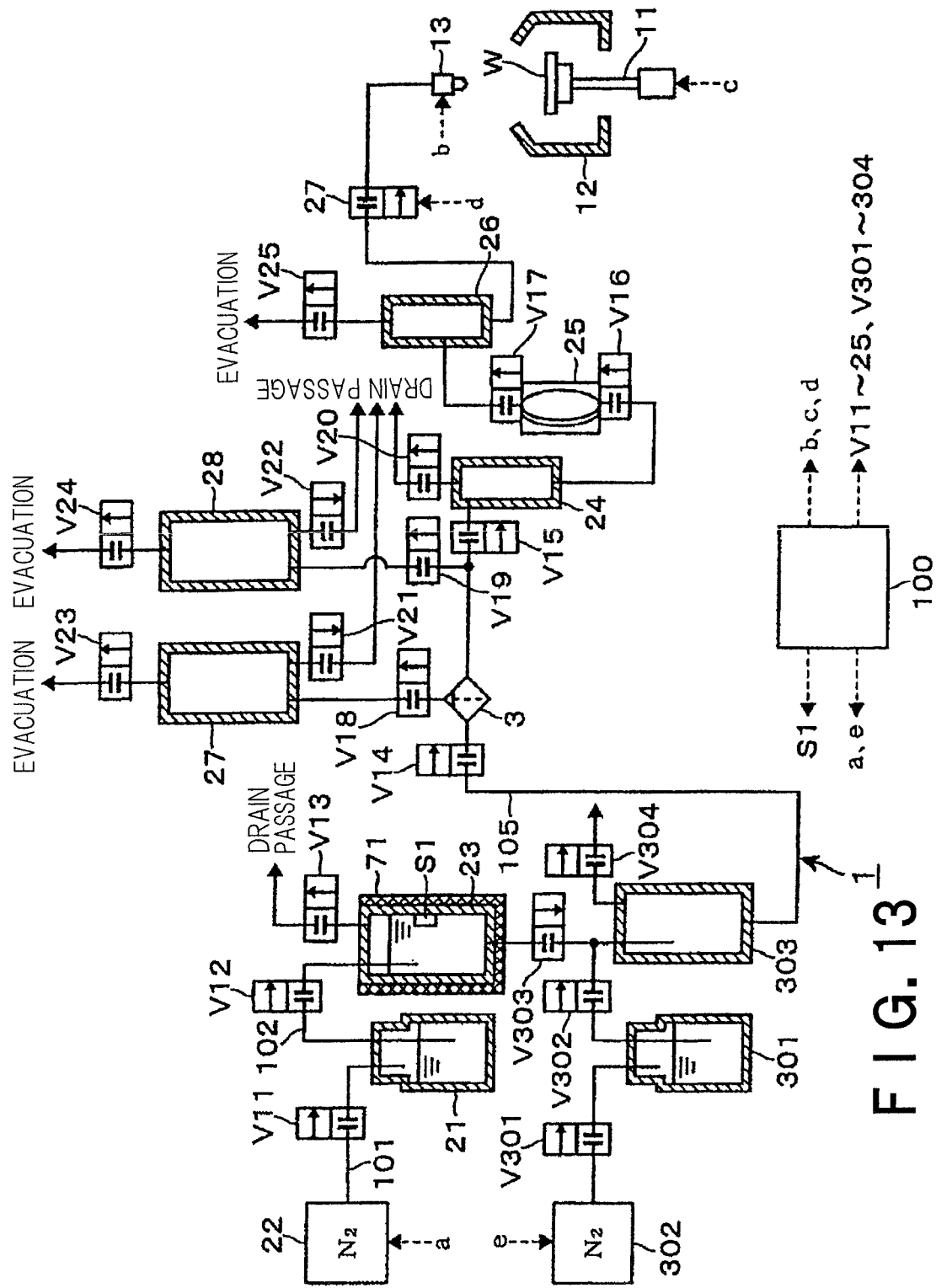
F I G. 13

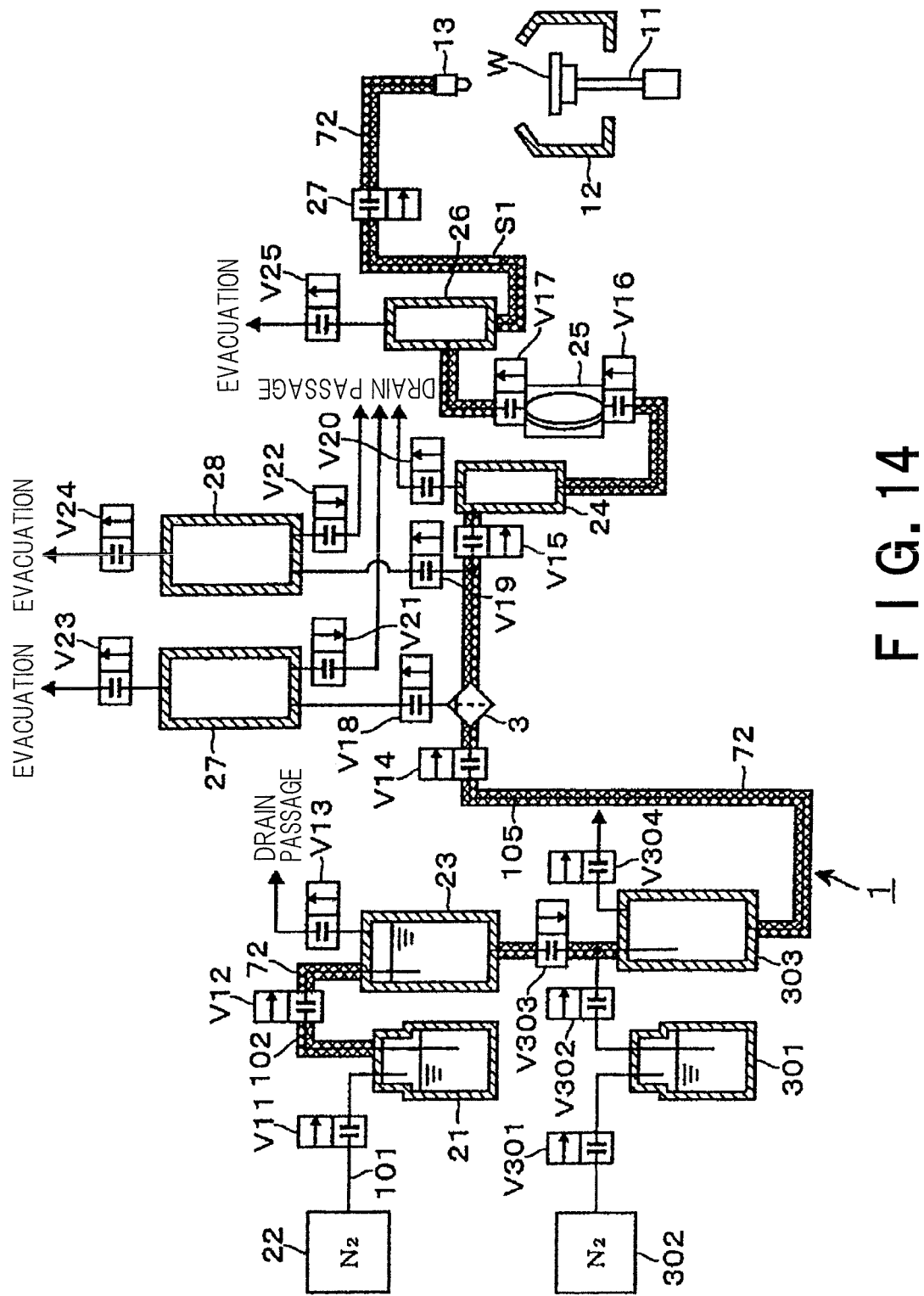
F I G. 14

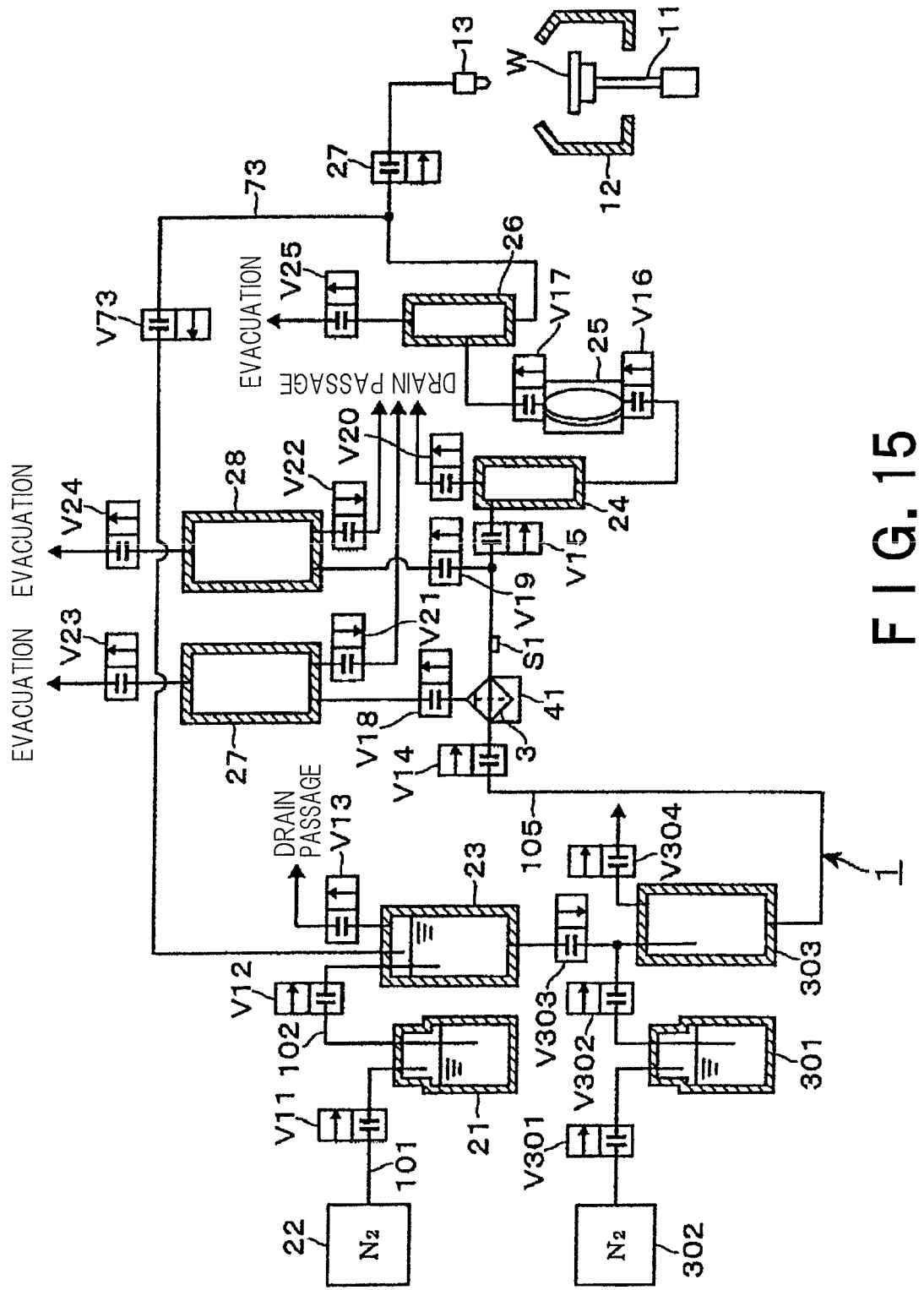
F I G. 15

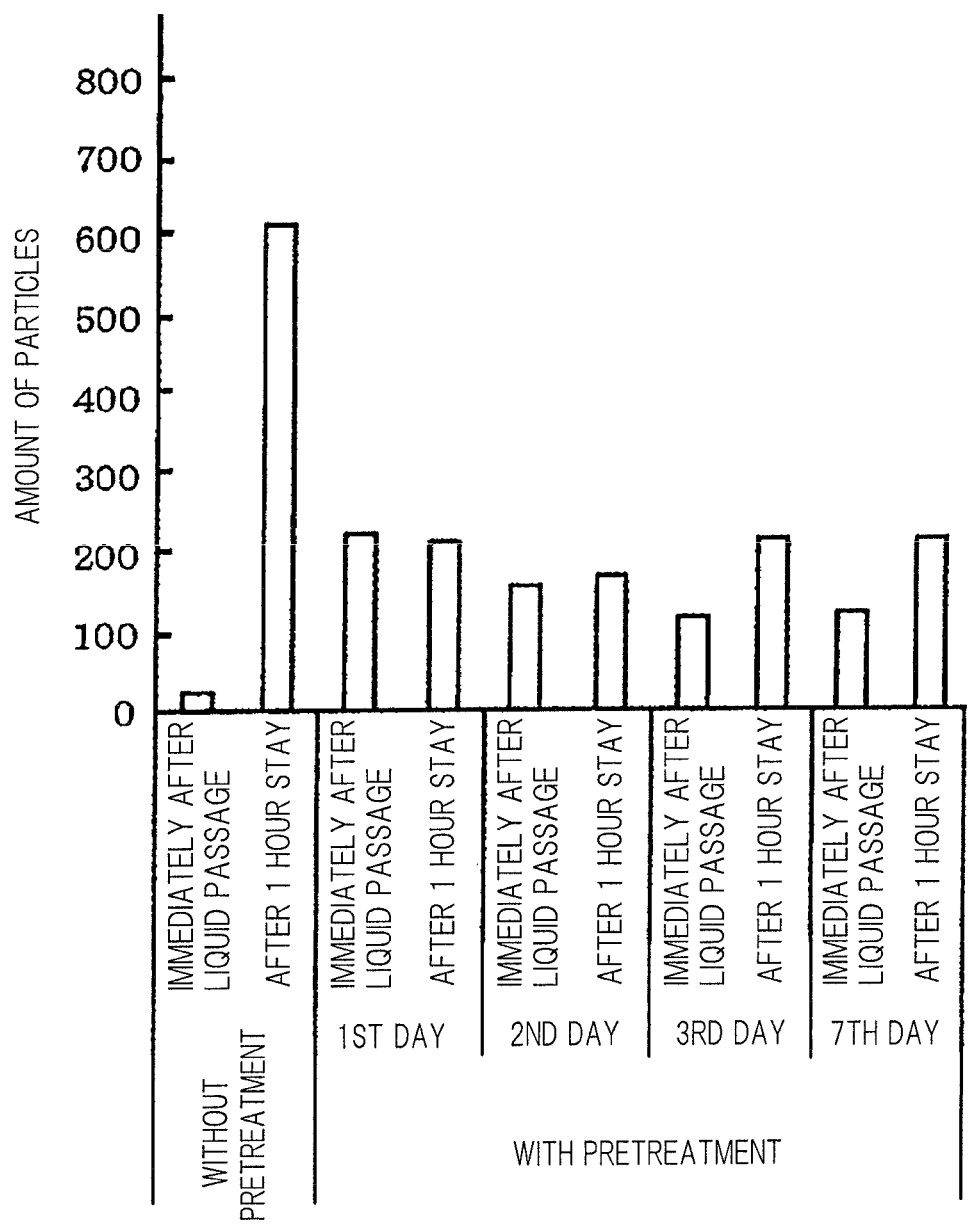
F I G. 17

FILTER UNIT PRETREATMENT METHOD, TREATMENT LIQUID SUPPLY APPARATUS, FILTER UNIT HEATING APPARATUS, AND TREATMENT LIQUID SUPPLY PASSAGE PRETREATMENT METHOD

CROSS REFERENCE TO RELATED APPLICATIONS

This application is a division of U.S. application Ser. No. 15/025,045 filed Mar. 25, 2016, which has been issued as U.S. Pat. No. 10,493,387, which in turn is the National Stage entry of International Application No. PCT/JP2014/075692, filed Sep. 26, 2014, which designated the United States, the entireties of which are incorporated herein by reference.

FIELD OF THE INVENTION

The present invention relates to a technique for pretreating a treatment liquid supply passage and a filter unit provided in the treatment liquid supply passage, in order to prevent generation of foreign matters which may be included in a solvent-containing treatment liquid used for performing a liquid treatment to a treatment object.

BACKGROUND OF THE INVENTION

A semiconductor manufacturing process includes a step that supplies a treatment liquid onto a substrate to perform a liquid treatment to a substrate. Such a liquid treatment step is performed by ejecting from a nozzle the treatment liquid that has been fed from a treatment liquid tank through a supply passage. A filter unit is provided in the treatment liquid supply passage to remove foreign matters included in the treatment liquid in the treatment liquid tank or foreign matters originated from piping and supply devices.

If a treatment starts immediately after a new filter unit is installed in the piping at the starting-up or maintenance of the apparatus, the filtration performance of the filter unit (i.e., the cleanliness of a liquid flowing out of a filter) is not stable, and thus a treatment cannot be performed normally. Thus, after installation of the filter unit, a pretreatment, such as a repetitive dummy dispensing operation or a long time circulation of the solvent, is performed until the filtration performance of the filter unit becomes stable. Even after stating of the treatment using the new filter unit, the filtration performance of the filter unit deteriorates so that an operation such as the dummy dispensing is again needed.

However, such an operation increases the solvent consumption and prolongs the standby time before the liquid treatment of substrates, resulting in productivity decline. The inventors have found through their research that elution of resins from the filter part of the filter unit, caused by the solvent contained in the treatment liquid, is one of reasons for instability in filtration performance of the filter unit. It has been found through the inventors' research that foreign matters derived from the eluted substance invite defects on substrates. Under the recent circumstances where the allowable level of defects caused by foreign matters becomes severer because of miniaturization of patterns, the eluted substance from the filter part is not a negligible problem.

In addition, when a new resist liquid supply apparatus is installed or when the type of the resist liquid used in the resist liquid supply apparatus is changed, cleaning of the inside of the resist liquid supply passage is recommended. To this end, the piping is filled with deionized water and is left for a predetermined period of time. This cleaning process requires a long period of time and a large amount of cleaning liquid consumption. In addition, since circuit patterns becomes more complicated, it is required to eliminate causes of lowering the throughput, by removing organic matters adhering to the liquid contacting parts of the piping and the supply devices.

Patent Document 1 describes a method of lowering absorption of foreign matters to a filter part in a substrate processing apparatus by changing the temperature of the filter part. The problem to be solved by the method differs from that of the technique disclosed below.

Patent Document: JP2013-030690A

SUMMARY OF THE INVENTION

One of the objects of the present invention is to provide a technique that can reduce contamination of the treatment object caused by a filter unit and that can also reduce the standby time caused by pretreatment of the filter unit, in a case where a solvent-containing treatment liquid (a treatment liquid containing a solvent) is supplied to a treatment object through the filter unit provided in a treatment liquid supply passage in order to perform a liquid treatment to the treatment object.

Another object of the present invention is to provide a technique that can suppress, through pretreatment of a treatment liquid supply passage, contamination of a treatment object caused by organic matters in the treatment liquid supply passage, and that can perform the pretreatment in a short time, in a case where a treatment liquid is supplied to the treatment object in order to perform a liquid treatment to the treatment object.

In one embodiment of the present invention, there is provided a method of pretreating a filter unit, wherein the filter unit is to be provided in a treatment liquid supply passage in order to remove foreign matters included in a solvent-containing treatment liquid for performing a liquid treatment to a treatment object, wherein the method includes a step of soaking a filter part with a solvent for pretreatment, wherein a solubility of a resin, which constitutes the filter part of the filter unit, to the solvent for pretreatment is greater than a solubility of the resin to a solvent used in the treatment liquid.

In another embodiment of the present invention, there is provided a treatment liquid supply apparatus that supplies a treatment object with a solvent-containing treatment liquid for performing a liquid treatment to the treatment object, wherein the apparatus includes:

a treatment liquid supply passage having one end to which a treatment liquid ejecting unit for ejecting the treatment liquid to the treatment object is provided, and having the other end to which a treatment liquid supply source is to be connected;

a filter unit provided in the treatment liquid supply passage in order remove foreign matters in the treatment liquid, the filter unit having a filter part made of a resin; and a pretreatment mechanism that establishes a condition in which the filter part is soaked with a solvent for pretreatment, wherein a solubility of a resin, which constitutes the filter part of the filter unit, to the solvent for pretreatment is greater than a solubility of the resin to a solvent used in the treatment liquid.

The "solvent-containing treatment liquid" means both the treatment liquid containing only 100% solvent and the treatment liquid comprising a mixture of a solvent and another component such as a coating film component.

In yet another embodiment of the present invention, there is provided an apparatus for heating a filter unit, wherein the filter unit is to be provided in a treatment liquid supply passage in order to remove foreign matters included in a solvent-containing treatment liquid for performing a liquid treatment to a treatment object, wherein the apparatus includes: a main body for receiving the filter unit therein; and a heating unit for heating the main body; wherein the heating unit includes a first storage part for storing a first reaction substance, a second storage part for storing a second reaction substance, isolated from the first storage part, that causes exothermic reaction upon contact with the first reaction substance, and an isolation releasing part that releases an isolated state of the the first and second reaction substances so as to bring them into contact with each other.

In yet another embodiment of the present invention, there is provided a method of pretreating a treatment liquid supply passage to eliminate foreign matters of organic matters that may be included in a solvent-containing treatment liquid for performing liquid treatment to a treatment object, wherein the pretreatment method includes: a step of supplying a solvent for pretreatment to the treatment liquid supply passage; and a step of thereafter discharging the solvent for pretreatment from the treatment liquid supply passage, wherein a solubility of the organic matters to the solvent for pretreatment is greater than the solubility of of the organic matters to the solvent contained the treatment liquid.

In still another embodiment of the present invention, there is provided a treatment liquid supply apparatus that supplies a treatment object with a solvent-containing treatment liquid for performing liquid treatment to the treatment object, wherein the apparatus includes: a treatment liquid supply passage having one end to which a treatment liquid ejecting unit for ejecting the treatment liquid to the treatment object is provided, and having the other end to which a treatment liquid supply source is to be connected; a pretreatment mechanism that supplies a solvent for pretreatment to an inside of the treatment liquid supply passage, wherein a solubility of organic matters to the solvent for pretreatment is greater than a solubility of the organic matters to the solvent contained in the treatment liquid.

In some of the aforementioned embodiments, the component that can be eluted from a resin constituting the filter part during a liquid treatment is forcibly eluted before execution of the liquid treatment. Thus, even if the treatment liquid stays in the filter unit for a long period of time, elution of the resin into the treatment liquid can be restrained. Therefore, a subsequent liquid treatment can be started without doing anything special, for example. In addition, the time required for the pretreatment that is to be performed immediately after the installation of a new filter unit in the treatment liquid supply passage can be reduced.

In some other embodiments, the organic matters adhering to the pretreatment supply passage can be removed by the solvent for pretreatment at a high removal ratio, and the pretreatment can be performed in a short period of time.

BRIEF DESCRIPTION OF THE DRAWINGS

FIG. 4 is a flowchart showing a method of operating the solvent supply apparatus.

FIG. 5 is a graph showing the molecular weight distribution of ultra high molecular polyethylene and high density polyethylene.

FIG. 6 is a piping diagram showing an embodiment of an apparatus for pretreating the filter unit, used in a second embodiment of the present invention.

FIG. 8 is a vertical cross sectional view showing another example of a main part of the pretreatment apparatus used in the second embodiment.

FIG. 10 is a chart for explaining Hansen solubility parameters.

FIG. 11 is a graph for explaining the solubility of polyethylene to each solvent.

FIG. 12 is a schematic diagram showing a pretreatment apparatus for a filter unit, used in the fourth embodiment of the present invention.

FIG. 13 is a piping diagram showing the solvent supply apparatus in a fifth embodiment of the present invention.

FIG. 14 is a piping diagram showing the solvent supply apparatus in a sixth embodiment of the present invention.

FIG. 15 is a piping diagram showing the solvent supply apparatus in a seventh embodiment of the present invention.

FIG. 17 is a graph showing a result of an evaluation test.

DETAILED DESCRIPTION OF THE INVENTION

First Embodiment

Figure 1:
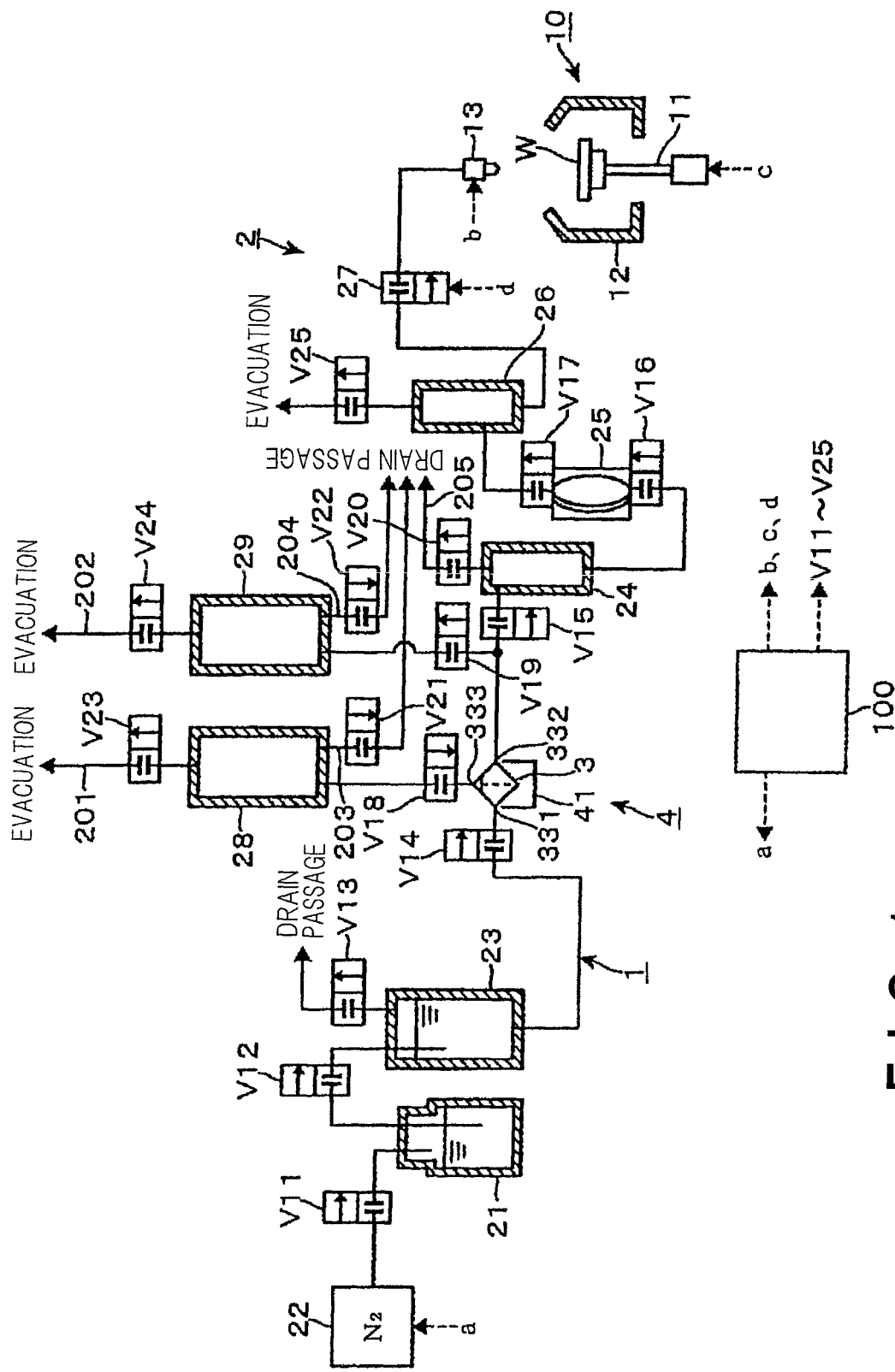
FIG. 1 is a piping diagram showing a solvent supply apparatus in a first embodiment of the present invention.

FIG. 1 is a diagram showing the overall configuration of a piping system of a solvent supply apparatus as one of embodiments of a treatment liquid supply apparatus of the present invention. The solvent supply apparatus is composed of a solvent supply source 21 including a solvent bottle, a liquid end tank 23, a filter unit 3, a first trap 24, a pump 35, a second trap 26, a dispensing valve 27 and a nozzle 13, which are disposed on a solvent supply passage 1 (comprising e.g., piping) in that order from the upstream side thereof. Reference signs V11 to V25 denote valves, and reference sign 10 denotes a liquid treatment unit. The filter unit 3 is provided for removing foreign matters (particles) contained in the solvent, while the first trap 24 and the second trap 26 are provided for removing bubbles in the solvent. In this example, the solvent is a treatment liquid.

The liquid treatment unit 10 includes a spin chuck 11 that holds a treatment object such as a wafer W, and a cup module 12 disposed around the spin chuck 11. For example, the solvent is supplied from the nozzle 13 to the rotation center of the wafer W and spreads over the surface of the wafer W such that the whole surface of the wafer W is wetted with the solvent. A resist liquid is supplied to the wafer W having been supplied with the solvent by another nozzle (not shown), for example. A resist liquid film is formed by a spin coating method. In this example, the solvent is used in a pre-wetting step that wets the wafer in advance W to allow the resist liquid to uniformly spread over the wafer W. The solvent supply apparatus shown in FIG. 1 includes: a mechanism section 2 that performs a wetting process in which the filter part 31 of the newly installed filter unit 3 is soaked with the solvent such that no gas bubbles remain in the filter part 31; and a mechanism section 4 that performs a pretreatment in which a part of a resin constituting the filter part 31 is forcibly dissolved.

Firstly, the mechanism section 2 for performing the wetting process is briefly explained. The mechanism section 2 includes: a trap tank 28 having a bottom that is connected to a vent port 333 of the filter part 31 through the valve V18; a trap tank 29 having a bottom that is connected to a branch passage branched from a supply passage connected to an outlet port 332 of the filter part 31 through the valve V19; and discharge passages 201 and 202 connected to upper surfaces of the trap tanks 28 and 29. Drain passages 203 and 204 are connected to the bottoms of the trap tanks 28 and 29, respectively.

The wetting process is performed as follows. The filter unit 3 in a dry state is firstly attached to in the solvent supply passage 1, with the respective valves being closed. Then, the valves V11, V12, V14, V18 and V21 are opened, so that a route extending from the solvent supply source 21 to the drain passage through the liquid end tank 23, the filter unit 3 and the trap tank 28 is opened. The interior of the solvent supply source 21 is then pressurized with $N_2$ gas to feed the solvent therefrom, so that the interior of the filter unit 3 is filled with the solvent. Subsequently, the valve V18 is closed, and the valves V19 and V22 are opened. The interior of the solvent supply source 21 is then pressurized with $N_2$ gas to allow the solvent to flow from the filter unit 3 toward the trap tank 29. Then, the valves V23 and V24 are opened so as to evacuate gas from the trap tanks 28 and 29 through the discharge passages 201 and 202, respectively. Thus, the interior of the filter unit 3 is depressurized, whereby gas dissolved in the solvent existing in the filter unit 3 comes out of the solvent in a form of bubbles. The solvent containing the bubbles is collected to the first tarp 24 by opening the valves V15 and V20, and is discharged from a drain passage 205. After that, the valves V16, V17 and V25 are opened to store the solvent in the second trap 26. Thereafter, the solvent (treatment liquid) is supplied from the nozzle 13 toward the liquid treatment unit 10, by opening the dispensing valve 27 and by driving the pump 25.

Figure 2:
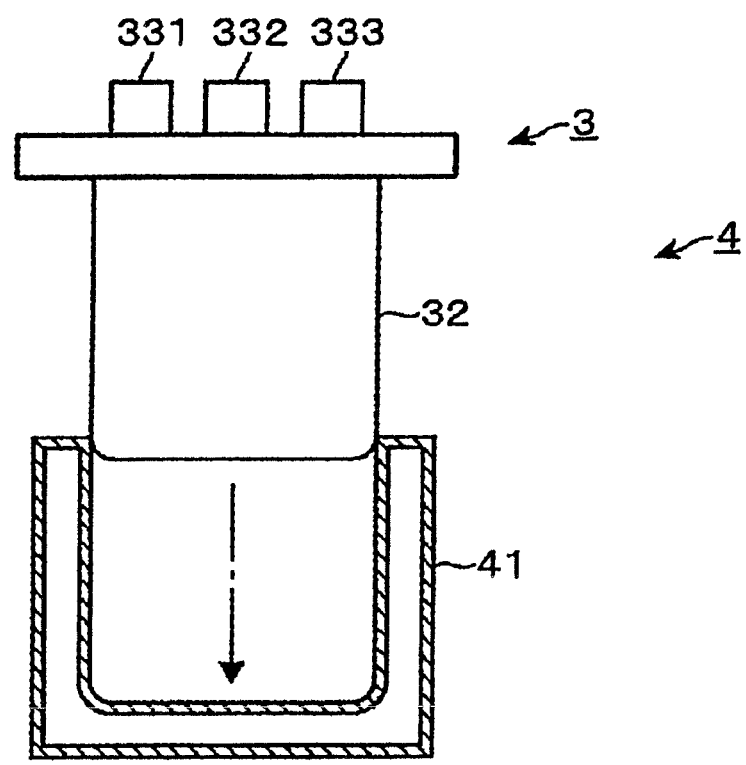
FIG. 2 is a partially-sectioned vertical cross sectional view showing an example of a filter unit to be pretreated according to the first embodiment and a related mechanism section.
Figure 3:
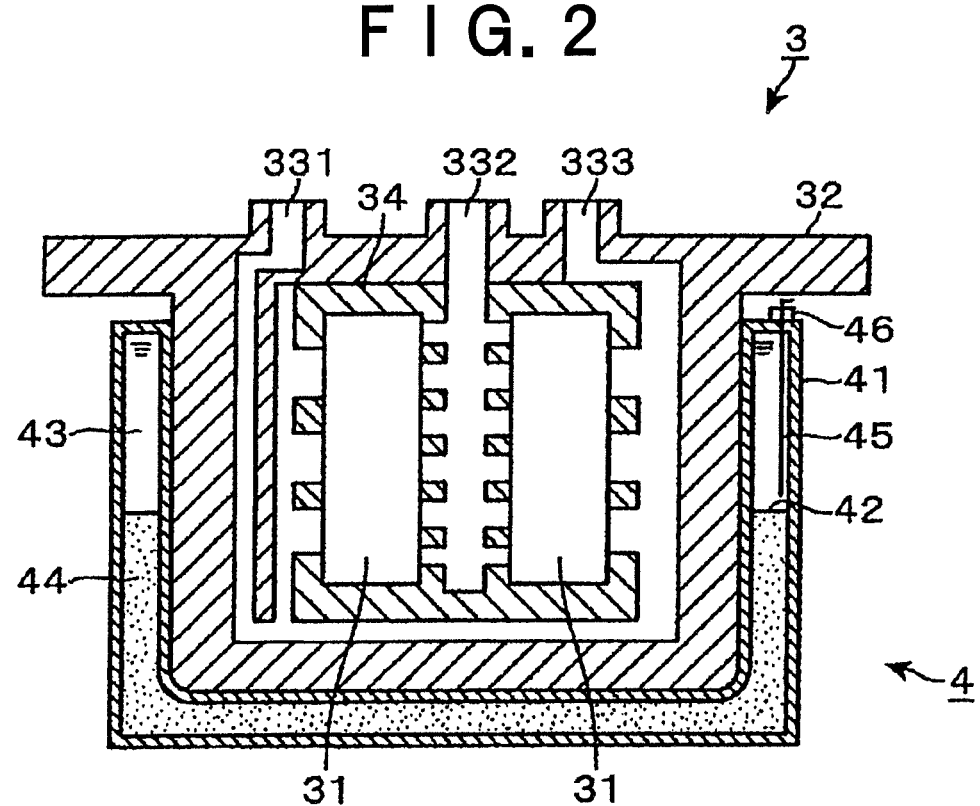
FIG. 3 is a vertical cross sectional view showing the example of the filter unit to be pretreated and the related mechanism section.

Next, the mechanism section 4 for performing the pretreatment is described together with the structure of the filter unit 3. As shown in FIGS. 2 and 3, a part of the filter unit 3 other than its upper part is fitted in a tubular, heat-generating cover member 41 having a bottom. The filter unit 3 is composed of the filter part 31, an outer case 32 and an inner case 34. For example, the filter part 31 is fabricated by folding a sheet material into a bellows-like shape and then rolling it into a cylinder, wherein the sheet material is made by attaching support members in a form of a net made of high density polyethylene (HDPE) to both surfaces of a planar filter body part made of ultra high molecular weight polyethylene (UPE). The inner case 34 has an outer tube and an inner tube, which are concentric with each other. A plurality of liquid passage ports are formed in the outer tube and the inner tube. The sheet member rolled into a cylinder (i.e., filter part 31) is fitted in an annular space between the outer tube and the inner tube. In an upper part of the outer case 32, there are three ports (an inlet port 331, an outlet port 332 and a vent port 333) for connecting the inside and the outside of the outer case 32. A liquid flow port is provided in a circumferential surface between the outer case 32 and the inner case 34, through which the solvent passes. The heat-generating cover member 41 is set so as to surround a lower part of the outer case 32.

The heat-generating cover member 41, which is made of a heat conductive material such as aluminum, has a hollow interior space. The interior of the heat-generating cover member 41 has a dual layered structure divided by a planer seal member 42 made of polyethylene, for example. An upper layer (first storage part) 43 stores, e.g., water ($H_2O$) and a lower layer (second storage part) 44 stores, e.g., calcium carbonate (CaO). Combination of the stored substances is not limited to $H_2O$ and CaO, as long as the below-described pretreatment can be performed effectively but boiling of the solvent does not occur by the heat generated by the reaction between the substances in the upper layer 43 and the lower layer 44. A seal cutter 45, having a needle shape for example, for breaking the seal member 42 penetrates the heat-generating cover member 41 from above. A stopper 46 is fitted to an upper part of the seal cutter 45 to prevent the seal member from being broken by the seal cutter 45 when it is not required.

The aforementioned solvent supply apparatus is controlled by a control unit 100. The control unit 100 is comprises a CPU, a main memory and a bus, etc. A control operation is performed by a program having commands (steps) for controlling the respective parts so as to carry out a predetermined process. The program is stored in a storage unit or a computer storage medium such as a flexible disk, a compact disk, a hard disk or an MO (magneto-optical disk), and is installed in a main memory. The programs to be installed in the main memory include programs for controlling the spin chuck 11, the $N_2$ gas supply source 22, the valves V11 to V25, the filter unit 3 and so on. The CPU reads the programs, so that the respective parts are controlled.

Next, the operation of the aforementioned embodiment is explained with reference to a flowchart shown in FIG. 4. After the new filter unit 3 fitted in the heat-generating cover member 41 is connected to the solvent supply passage 1, the wetting process of the filter part 31 is performed as described above, so that the filter part 31 is soaked with the solvent and that there remains no bubbles in the filter part 31 (step S1). The wetting process may be manually performed by an operator who operates the valves with the use of an operation panel constituting a part of the control unit 100, or by executing a program having sequences of the wetting process, which is stored in the memory of the control unit 100.

Then, there is performed the pretreatment (dissolving process) by which components, which can be eluted into the solvent from the resin forming the filter part 31 of the filter unit 3, is forcibly eluted. To be specific, an operator detaches the stopper 46 and pushes the seal cutter 45 inwardly to break the seal member 42, so that the $H_2O$ layer 43 and the CaO layer 44 react with each other whereby the heat-generating cover member 41 generates heat (step S2). Thus, the filter unit 3 is heated to, e.g., 60° C., and the heated filter unit 3 is left as it is for, e.g., two hours (step S3). Following thereto, the valve V18 in communication with the vent port 333 is opened, so that the interior of the filter unit 3 is purged by the solvent (step S4). After completion of the purging, the valve V19 in communication with the outlet port 332 is further opened, so that the interior of the filter unit 3 is again purged by the solvent (step S5).

Then, the solvent in the filter unit 3 is discharged from the outlet port 332 (step S6). The series of steps S4 to S6 are repeated predetermined times, for example, twice. The filter unit 3 is maintained to be heated at 60° C. until the repetition of the steps is finished. After completion of the pretreatment, a new solvent as a treatment liquid is injected from the solvent supply source 21 into the solvent supply passage 1 (step S7), so that the apparatus becomes the standby state for the liquid treatment. In the foregoing embodiment, the heating temperature of the filter unit 3 is 60° C. However, not limited thereto, the heating temperature may be within a temperature range between the normal temperature of 23° C. and a temperature at which the filter part 31 is not altered.

After completion of the pretreatment, the subsequent steps may be performed with the heat-generating cover member 41 being continuously attached to the filter unit 3, or alternatively, the heat-generating cover member 41 may be detached. The filling amounts of $H_2O$ and CaO in the heat-generating cover member 41 may be adjusted such that heat can be generated only for a period of time required for the pretreatment. In this case, after completion of the pretreatment, the temperature of the filter unit 3 decreases to an atmospheric temperature. Thus, if the liquid treatment to the substrate is not sensitive to the solvent temperature, the liquid treatment may be performed by using the solvent continuously after the completion of the pretreatment, without detaching the heat-generating cover member 41. However, if the liquid treatment to the substrate by the solvent or the subsequent solvent is sensitive to a solvent temperature, it is desirable that the heat-generating cover member 41 is detached from the filter unit after the pretreatment, and that the temperature of the solvent for liquid treatment is controlled (e.g., raised). In both cases, after the completion of the pretreatment, the liquid treatment to a wafer W is performed by using the solving supply apparatus. For example, the liquid treatments is performed such that the wafer W is coated with solvent by the spin coating method by ejecting the solvent onto the wafer W by 0.1 mL, for example, by pressurization of the pump unit 25.

The advantage of the operating method of the aforementioned solvent supply apparatus is explained. As described above, the filter part 31 of the filter unit 3 is composed of the filter body part made of UPE, and the support members made of HDPE supporting the filter body part from both sides. FIG. 5 shows molecular weight distributions of UPE and HDPE. As shown in FIG. 5, the peak of the UPE molecular weight is about 4,500,000 while the peak of the HDPE molecular weight is about 100,000. That is, the molecular weight distributions of them do not substantially overlap with each other.

The cause for the aforementioned problem, i.e., the fact that retaining the solvent in the filter unit 3 results in increment of particles in the liquid, is considered that a part of the HDPE component constituting the support members of the filter unit 31, i.e., low density polyethylene which is a low molecular weight component in the HDPE, present in a rectangular portion surrounded by the dotted lines in FIG. 5, is eluted into the solvent. Thus, in the embodiment of the present invention, at the installing of the filter unit 3 in the solvent supply passage 1, the heated solvent is brought into contact with the filter part 31. The heated solvent corresponds to the solvent for pretreatment. Since the solubility of the resin, which is to be removed, to the heated solvent is greater than the solubility of the resin to the solvent used in the liquid treatment, the low molecular weight component of the filter part 31 can be forcibly eluted before the operation for the liquid treatment.

Thus, even if the solvent for the liquid treatment (i.e., treatment liquid) stays in the filter unit for a long period of time, the elution of the resin into the solvent is suppressed. In this embodiment, the low density polyethylene is eluted into the heated solvent by heating the solvent supplied into the filter unit 3. That is to say, the heat-generating cover member 41 may be called a forced dissolving mechanism for polyethylene. In the above embodiment, although the heating of the filter unit 3 is started after the solvent has been supplied to the filter unit 3, the solvent may be supplied to the filter unit 3 after the heating of the filter unit 3 has been started. In addition, as described in the below second embodiment, the piping of the filter unit 3 may be preheated by a ribbon heater or the like.

Second Embodiment

The second embodiment is related to a method for performing the aforementioned pretreatment to a new filter unit 3, which has not yet been installed in the treatment liquid supply apparatus, by using a dedicated pretreatment apparatus 5 shown in FIG. 6. In the pretreatment apparatus 5, a solvent supply passage 501 is inserted into a bottle 21a storing a solvent. An inlet port 331 of the filter unit 3 is connected to the solvent supply passage 501. A solvent discharge passage 503 is connected to an outlet port 332 of the filter unit 3. A vent pipe 502 is connected to a vent port 330 of the filter unit 3. In addition, the vent pipe 502 and the solvent discharge passage 503 merge into a solvent discharge passage 504. Reference signs V12, V51 and V52 denote valves, reference sign 21a denotes a solvent supply source and reference sign 22a denotes an $N_2$ gas supply source. The filter unit 3 is dipped in a liquid tank 51. The liquid tank 51 is filled with warm water heated by a heater 53.

Figure 7A:
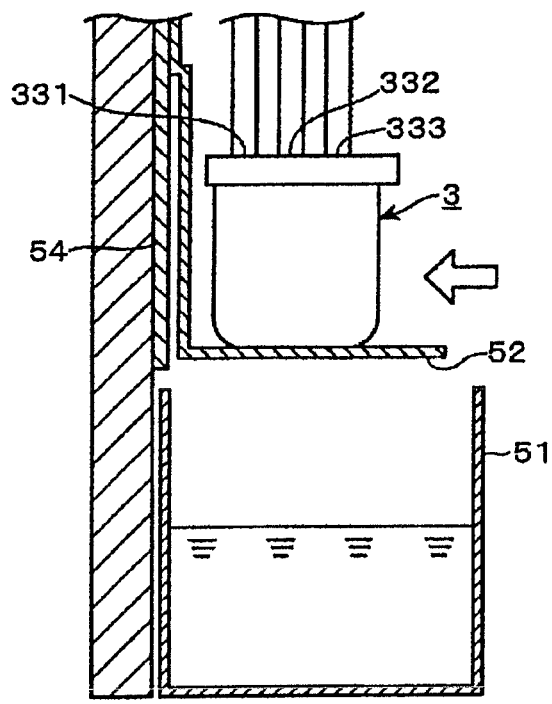
FIGS. 7A and 7B are vertical cross sectional view showing an example of a main part of the pretreatment apparatus used in the second embodiment.
Figure 7B:
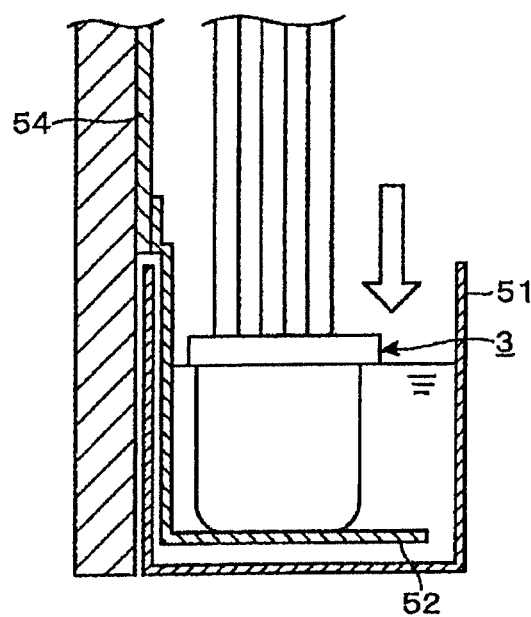

FIG. 6 shows the situation where the filter unit 3 is attached to the pretreatment apparatus 5. The new filter unit 3 is firstly attached to the solvent supply passage 1 of the solvent supply apparatus shown in FIG. 1 (the heat-generating cover member 41 is not used). Then, the the wetting process is performed in the manner as described above. Thereafter, the filter unit 3 is attached to the pretreatment apparatus 5 so as to be dipped in the liquid tank 5. The filter unit 3 is left as it is for a predetermined period of time to heat the solvent in the filter unit 3. Then, with the valves V12 and V51 being opened while the valve V52 being closed, $N_2$ gas is pressure-fed from the $N_2$ gas supply source 22a so that the solvent is pressure-fed from the bottle 21a to the filter unit 3. By opening the vent port 333, the interior of the filter unit 3 is purged. Thereafter, with the valve V51 being closed and the valve V52 being opened, $N_2$ gas is pressure-fed from the $N_2$ gas supply source 22a so that the solvent is pressure-fed to the filter unit 3. By discharging the solvent from the outlet port 332, the interior of the filter unit 3 is purged. Then, the solvent in the filter unit 3 is discharged. These steps are repeated plural times, e.g., twice. Finally, a new solvent is injected into the filter unit 3. FIGS. 7A and 7B show elevation mechanisms 52, 54 for dipping the filter unit 3 in the liquid tank 51.

The filter unit 3 having been subjected to the above pretreatment is detached from the pretreatment apparatus 5, and is again attached to the solvent supply passage 1 of the solvent supply apparatus in the first embodiment. Thereafter, a liquid treatment to a wafer W is performed. The method in the second embodiment is advantageous in a case where fire and high temperatures must be avoided in the treatment liquid supply apparatus, for example, and is also advantageous in a case where the temperature and the time must be controlled in the pretreatment to the filter unit 3. A part of the piping 501 (piping on the upstream side of the filter unit 3) may be dipped in the liquid tank 51 as shown in FIG. 8 in order to avoid solidification and precipitation of the eluted substance, which may be caused by lowering of the temperature in the filter unit 3 due to inflow of non-heated solvent into the filter unit 3 when the filter unit 3 is being heated. In place of dipping the piping 501 in the liquid tank 51, the solvent flowing into the filter unit 3 may be heated by heating the piping 501 by a ribbon heater or the like in order to avoid precipitation of the eluted substance.

Third Embodiment

Figure 9:
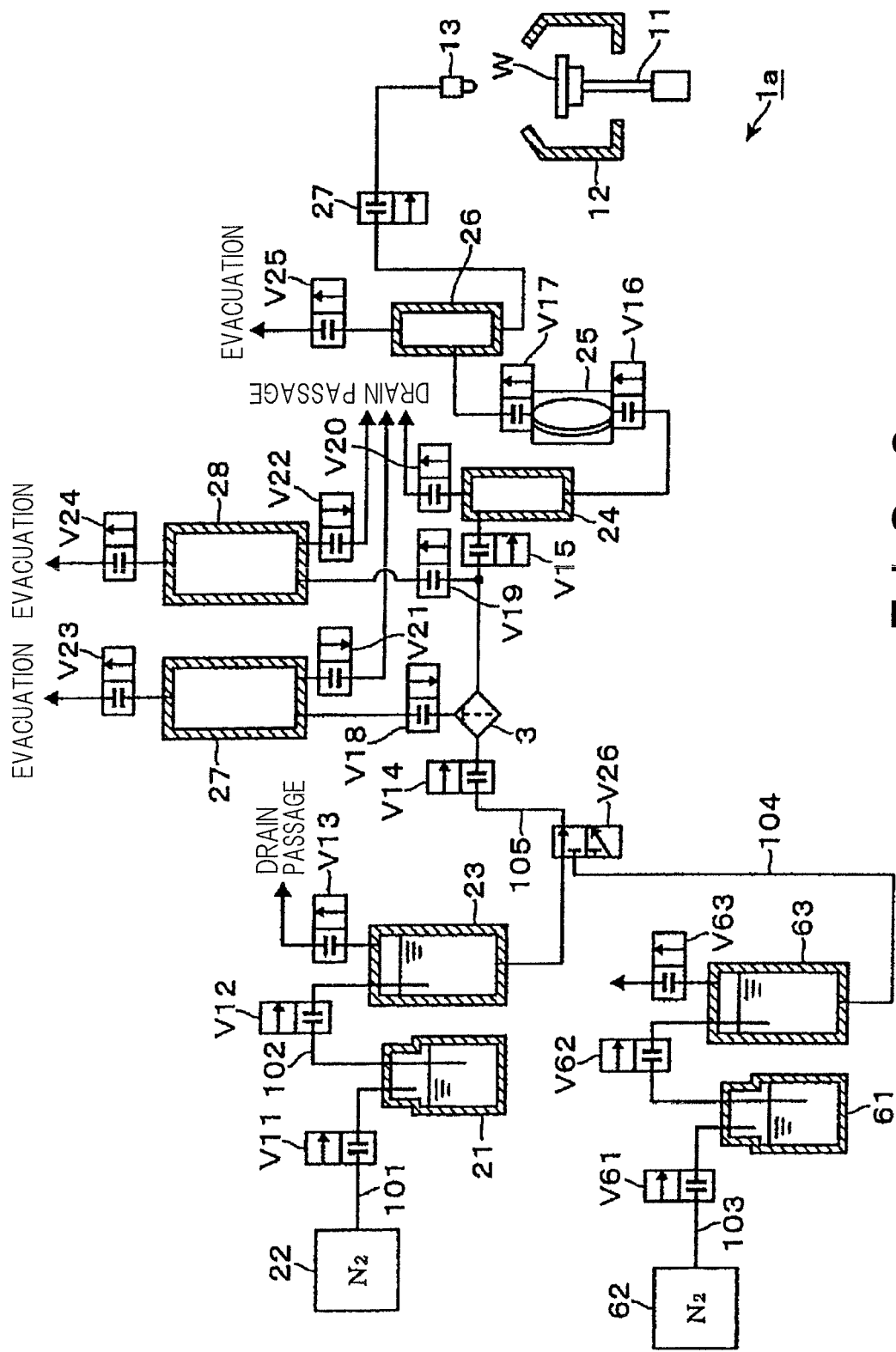
FIG. 9 is a piping diagram showing a solvent supply apparatus in a third embodiment of the present invention.

A solvent supply apparatus in a third embodiment of the treatment liquid supply apparatus of the present invention is explained with reference to FIG. 9. The same reference signs are assigned to the same constituent elements as those of the solvent supply apparatus in the first embodiment, and explanation thereof is omitted. The structure of the solvent supply apparatus in the third embodiment on the downstream side of a valve V14 is the same as that of the solvent supply apparatus in the first embodiment, except that the mechanism section 4 having the heat-generating cover member 41 is not provided. On the upstream side of the valve V14 of a solvent supply passage 105 provided with the filter unit 3, the solvent supply passage 105 is branched into two branch passages (101+102; 103+104) through a switching valve V26. An $N_2$ gas supply source 22, a first solvent supply source 21 and a liquid end tank 23 are disposed in one of the branch passages in that order from the upstream side. An $N_2$ gas supply source 62, a second solvent supply source 61 and a liquid end tank 63 are disposed in the other branch passage in that order from the upstream side.

Next, an operating method of the solvent supply apparatus in the third embodiment is explained. At the startup or maintenance of the solvent supply apparatus, a new filter unit 3 is installed in the solvent supply apparatus. By switching the switching valve V26 to the side of the bottle 61, the wetting process is performed with the use of a second solvent in accordance with the procedure described in the first embodiment. Following thereto, the filter unit 3 having been subjected to the wetting process is pretreated by using the second solvent. The third embodiment differs from the first embodiment in that the heat-generating cover member 41 used in the first embodiment does not exist in the former, so that the pretreatment is performed without heating the filter unit 3.

After completion of the pretreatment, a liquid treatment is performed to a wafer W. To be specific, the switching valve V26 is switched to the side of the bottle 21, and $N_2$ gas is pressure-fed from the $N_2$ gas supply source 22 into the bottle 21 so that a first solvent is supplied into the solvent supply passage 1a from the first solvent supply source 21. Then, the first solvent is ejected from the nozzle 13 onto the wafer W by pressurization of the pump unit 25, and a liquid film is formed on the wafer W by the spin coating method. In the third embodiment, the first solvent is a solvent for liquid treatment, i.e., a treatment liquid.

Next, the type of the second solvent usable in the third embodiment is explained. The second solvent is a solvent for pretreatment. The solubility of polyethylene (constituting the filter unit) to the second solvent is greater than the solubility of polyethylene to the first solvent. Hansen solubility parameters (HSP) are known as one of indexes indicating solvent properties. HSP specifies the solubility between substances (for example, the solubility of a certain substance to a solvent) by using a multidimensional vector (composite vector 200) having a dispersion term dD, a polarity term (polarity term) dP and a hydrogen bonding term dH, as shown in FIG. 10. The dispersion term corresponds to an energy derived from a Van der Waals force, the polarity term corresponds to an energy derived from a polar force between molecules, and the hydrogen bonding term corresponds to an energy derived from a hydrogen bonding force between molecules. Values of the respective terms are uniquely determined if the molecular structure of a substance (solvent) is specified.

FIG. 11 is a graph showing differences of respective solvents from polyethylene in the magnitude of the polarity term and the hydrogen bonding term among the Hansen solubility parameters. As the difference between a solvent and polyethylene for each term becomes closer to zero, the property of the solvent and the polyethylene are more similar. Accordingly, the closer to the origin a solvent is plotted, the greater the solubility of polyethylene to the solvent is. In the embodiments of the present invention, the treatment liquid is not limited to a solvent (100% solvent) but may be a resist liquid. Propylene glycol monomethyl ether acetate (PGMEA), propylene glycol monometyl ether (PGME) or a mixture of these solvents is used as a solvent (first solvent) contained in the resist liquid, for example. These solvents correspond to "solvent contained in a treatment liquid for liquid treatment". It can be said that a solvent which dissolves polyethylene more than these solvents is suitable as the second solvent in the third embodiment. Namely, in FIG. 11, a solvent plotted closer to the origin than PGMEA and PGME, for example, decalin, cyclohexanone and n-butylamine are suited for the second solvent in the third embodiment.

The third embodiment uses, as the solvent for pretreatment, a solvent to which the solubility of polyethylene is greater than the solubility of polyethylene to "the solvent contained in the treatment liquid for liquid treatment" that is used when a treatment object is subjected to the liquid treatment. In the first and second embodiments, a solvent for liquid treatment in a heated state is used as the solvent for pretreatment. On the other hand, the third embodiment uses, as the solvent for pretreatment, a solvent that dissolves substances to be dissolved more than a solvent contained in a treatment liquid for the liquid treatment at the same temperature, and that is of the different type from the latter. That is, the second solvent supply mechanism may be called a forced dissolving mechanism for polyethylene.

Fourth Embodiment

In place of the first to third embodiment or in combination with those embodiments, a pretreatment apparatus using ultrasonic waves shown in FIG. 12 may be used. In FIG. 12, reference sign 7 denotes a pretreatment apparatus using ultrasonic waves in a fourth embodiment. A container 72 is configured to accommodate the filter unit 3. The container 72 is filled with a liquid that is an ultrasonic propagating medium, e.g., water. Reference sign 71 denotes an ultrasonic generator. A low molecule component inside the filter unit 3 is dissolved into a solvent by ultrasonic waves applied from the ultrasonic generator 71. By applying ultrasonic waves to the solvent for liquid treatment, the solubility of the low molecular weight component increases. Namely, in the fourth embodiment, the solvent to which ultrasonic waves are applied corresponds to the solvent for pretreatment. Also in the fourth embodiment, the pretreatment is performed in accordance with the flowchart shown in FIG. 4, with ultrasonic waves being applied. The fourth embodiment can also provide the same advantages as those of the aforementioned embodiments. The pretreatment apparatus 7 may be incorporated in the aforementioned solvent supply apparatus, or may be a separate apparatus independent from the solvent supply apparatus.

In the above embodiments, although the component of the filter part is forcibly eluted into the solvent for pretreatment, the filter part 31 of the filter unit 3 may be formed of a material that is unlikely to be eluted to the solvent. For example, the support member of the filter part 31 may be formed of a substance, e.g., a silicone resin, which is slightly soluble to organic solvents and soluble to water.

The treatment liquid is not limited to a treatment liquid containing only 100% solvent, but may be a treatment liquid comprising a solvent in which a resist or a coating film component, such as a precursor of an insulation film, is dissolved. In this case, the solvent contained in the treatment liquid corresponds to a solvent which is a dissolving medium in which a precursor of a resist or an insulation film is dissolved. In the above embodiments, although the solvent used in the pretreatment contains only 100% solvent, the solvent used in the pretreatment is not limited thereto but may be a heated liquid containing the same components as those of the solvent-containing treatment liquid, for example. In a concrete example, in a resist liquid supply apparatus, a step of soaking the filter part 31 with a resist liquid having a temperature higher than that of the resist liquid during a liquid treatment (during which the resist liquid is supplied to a wafer W) corresponds to a step of soaking the filter part 31 with a solvent for pretreatment.

Fifth Embodiment

FIG. 13 is a diagram showing a resist liquid supply apparatus in a fifth embodiment of the treatment liquid supply apparatus of the present invention. In the embodiment of FIG. 1, the structure related to the solvent supply source 21 and the liquid end tank 23 correspond to a structure for supplying a solvent as a treatment liquid. On the other hand, in the embodiment of FIG. 13, although a solvent supply source and a liquid end tank are indicated by the same reference signs, a solvent supplied therefrom is not a solvent for liquid treatment but a solvent for pretreatment, i.e., a solvent for cleaning the inside of piping. A supply source (resist liquid bottle) of a resist liquid that is a treatment liquid and a liquid end tank (buffer tank) are indicated by reference signs 301 and 303, respectively. Reference sign 302 denotes an $N_2$ gas supply source and reference signs V301 to V304 denote valves. Since a resist liquid supply passage has the same structure as that of the solvent supply passage 1 in the first to fourth embodiments, the same reference sign 1 is assigned thereto for the convenience of explanation.

The fifth embodiment is related to a structure for cleaning and removing, by means of a solvent, organic matters adhering to the inside of piping (pipes) serving as the resist-liquid supply passage 1 and liquid-contacting parts of supply components such as a valve. In the fifth embodiment, the heat-generating cover member 41 covering the filter unit 3, which is provided in the first embodiment, is not provided. A jacket heater 71 is attached to the liquid end tank 23. A temperature detection unit S1 is disposed in the liquid end tank 23. The control unit 100 has a program for performing a cleaning process by means of a solvent, which is described in the below description of the operation. The program includes a group of steps for performing the below-described operation. The same control unit 100 is provided in the apparatus in the below-described embodiments.

Next, the operation of the fifth embodiment is explained. The cleaning of the resist liquid supply passage 1 is performed when a new resist liquid supply apparatus is incorporated in a liquid treatment apparatus, or when a resist liquid is replaced with a resist liquid of a different type. Firstly, with the valve V302 between the resist liquid supply source 301 and the buffer tank 303 being closed, the liquid end tank 23, the buffer tank 303 and a part of the resist liquid supply passage 1, which is on the downstream side of the buffer tank 303, are filled with a solvent fed out from the solvent supply source 21. Following thereto, the solvent in the liquid end tank 23 is heated by the jacket heater 71. The target heating temperature (set temperature) is a temperature at which the below-described organic matters adhering to the inside of the resist liquid supply passage 1 can be dissolved, but at which the filter unit 3 is not altered. In more detail, the solvent set temperature may be a temperature at which, even if the solvent is cooled because of the contact between the solvent and the piping until the solvent reaches the nozzle 13, the dissolved state of the organic matters can be maintained. The set temperature is, e.g., 60 to 100° C., for example, 70° C.

After the solvent in the liquid end tank 23 has reached the set temperature, the valves V14, V15, V16, V18, V21 and V23 are opened, and the inside of the pump 25 is depressurized to suction the heated solvent from the inside of the liquid end tank 23 into the pump 25 through the resist liquid supply passage 1. The solvent stays in the pump 25 for a predetermined period of time, e.g., 10 seconds. Thereafter, the solvent is ejected from the nozzle 13 by opening the valve V25 and the dispensing valve 27 and by pressurizing the pump 25. After the solvent in the pump 25 has been ejected, all the valves are closed again.

Then, the solvent temperature detected by the temperature detection unit S1 is compared with the set temperature. If the solvent temperature is within a predetermined range from the set temperature, the suctioning of the solvent into the pump 25 and the ejection of the solvent from the nozzle 13 are performed again. On the other hand, if the solvent temperature of the solvent is outside below the predetermined range of the set temperature, the solvent is again heated until the temperature of the solvent reaches the set temperature. When the temperature of the solvent reaches the set temperature, the suctioning of the solvent into the pump 25 and the ejection of the solvent from the nozzle 13 are performed again.

The step of suctioning the heated solvent into the pump 25 and the step of ejecting the solvent from the nozzle 13 are each repeated e.g., 100 times until an amount of the solvent, e.g., twice as the piping volume is ejected from the nozzle 13. In order to avoid the situation where the liquid end tank 23 is heated when it is empty, the valve V12 may be opened at the timing of the suctioning of the solvent into the pump 25 to replenish the liquid end tank 23 with a suitable amount of the solvent from the solvent supply source 21.

After completion of the above cleaning process of the resist liquid supply passage 1, a liquid treatment using a resist liquid is performed in the resist liquid supply apparatus. For example, by closing the valve V303, the solvent in the resist liquid supply passage 1 is discharged. Then, by opening the valve V301, V302 and V304, a resist liquid is supplied from the resist liquid supply source 301 into the resist liquid supply passage 1. Thereafter, the resist liquid in the buffer tank 303 is ejected onto each wafer W by, e.g., 0.1 mL, by pressurization of the pump 25 to coat each wafer W by the spin coating method.

Advantageous effects of the operation by the aforementioned solvent supply apparatus are explained. In the fifth embodiment, before the operation in which the resist liquid is supplied onto a wafer W, the solvent is heated in the liquid end tank 23 and is supplied into the resist liquid supply passage 1. The resist liquid is produced by dissolving a resist component in a solvent, and the temperature of the resist liquid, when it is supplied to a wafer W to perform a liquid treatment of the wafer W (a film forming process of a resist film), is a normal temperature. The solubility of the organic matters to the heated solvent is greater than the solubility of the organic matters to the solvent when it is used during the liquid treatment. In addition, since the heated solvent has an increased affinity to the organic matters, the solvent easily permeates between a liquid-contacting part of the inner wall of the piping or a component such as a valve and organic matters adhering thereto. Further, the organic matters themselves are heated to be softened. Thus, since the organic matters easily dissolve and removed from the inner wall of the piping and so on, the inside of the resist liquid supply passage 1 can be cleaned for a short period of time, and the solvent consumption can be reduced. According to the fifth embodiment, the amount of the organic matters adhering to the inside of the resist-liquid supply passage 1 can be reduced by the solvent, before execution of the liquid treatment using the resist liquid.

In the above fifth embodiment, the solvent is heated by the jacket heater 71 attached to the liquid end tank 23. However, the liquid end tank 23 may be heated by a ribbon heater in place of the jacket heater 71. Alternatively, the whole liquid end tank 23 may be heated by temperature-regulated water. Also in those cases, the same advantageous effects can be obtained.

Sixth Embodiment

FIG. 14 is a diagram showing the whole piping system of a solvent supply apparatus in a sixth embodiment of the treatment liquid supply apparatus of the present invention. The same reference signs are assigned to the same constituent elements in the sixth embodiment (also in a seventh embodiment described later) as those in the fifth embodiment, and description thereof is omitted. The sixth embodiment differs from the fifth embodiment in that: the surface of piping extending from the solvent supply source 21 to the nozzle 13 is covered with a ribbon heater 72 (instead of attaching the jacket heater 71 to the liquid end tank 23); and that the temperature detection unit S1 is located on the pipe surface immediately before the dispensing valve 27, for example.

In the sixth embodiment, the solvent in the resist liquid supply passage 1 is heated to the set temperature by the ribbon heater 72. Then, similarly to the fifth embodiment, the step of suctioning the solvent by the pump 25 and the step of, after the lapse of a predetermined period of time, ejecting the solvent from the pump 25 through the nozzle 13 are each repeated predetermined times. By passing the heated solvent through the resist liquid supply passage 1 in this manner, the same advantages as those of the fifth embodiment can be obtained.

Seventh Embodiment

FIG. 15 is a diagram showing the whole piping system of a seventh embodiment of the present invention. The seventh embodiment differs from the fifth embodiment in that: in place of the jacket heater 71, the heat-generating cover member 41 used in the first embodiment is disposed on the filter unit 3; and that there is provided a branch passage 73 that branches from the resist liquid supply passage 1 on the immediately upstream side of the dispensing valve 27 so as to return the solvent to the liquid end tank 23 through the valve V73. In the seventh embodiment, the temperature detection unit S1 is located on the immediately downstream of the filter unit 3, for example.

Next, the operation of the seventh embodiment is explained. Firstly, with the valve V302 between the resist liquid supply source 301 and the buffer tank 303 being closed, a section of the resist-liquid supply passage 1 including the liquid end tank 23, the buffer tank 303, and the filter unit 3 on the downstream side of the buffer tank 303 is filled with the solvent stored in the solvent supply source 21. Following thereto, the solvent in the filter unit 3 is heated by the heat-generating cover member 41.

After the solvent in the filter unit 3 has reached the set temperature, the valves V14, V15, V16, V18, V21 and V23 are opened and the inside of the pump 25 is depressurized, so as to suction the heated solvent from the interior of the liquid end tank 23 into the pump 25 through the resist liquid supply passage 1. After the solvent has been stayed in the pump 25 for a predetermined period of time, the valves V17 and V73 are opened and the pump 25 is pressurized so as to return the solvent to the liquid end tank 23. After the solvent in the pump 25 has been discharged, the valves V17 and V73 are closed. The aforementioned step of suctioning the heated solvent into the pump 25 and the step of returning the solvent from the pump 25 to the liquid end tank 23 may be repeated until an amount of liquid which is twice as the piping volume has been circulated in a circulation path comprising the liquid end tank 23, the resist-liquid supply passage 1 and the branch passage 73.

In the seventh embodiment, the solvent is heated in the filter unit 3 in the resist liquid supply passage 1, and the heated solvent is returned to the liquid end tank 23 through the branch passage 73 so as to be reused. Thus, the temperature of the solvent is hardly lowered. In addition, the solvent consumption is reduced.

In the seventh embodiment, the heat-generating cover member 41 is attached to the filter unit 3, and the solvent passing through the resist liquid supply passage 1 is heated and kept warm by heating the filter unit 3. However, the part of the resist liquid supply passage 1 where the solvent is heated is not limited to the filter unit 3. For example, the liquid end tank 23 or the pump 25 may be heated. Alternatively, a predetermined length range of the piping constituting the resist liquid supply passage 1 may be locally heated.

The apparatus structures in the aforementioned fifth to seventh embodiments can be combined with each other. For example, it is possible to combine the liquid end tank 23 having the jacket heater 71 in the fifth embodiment with the resist liquid supply passage 1 covered with the ribbon heater 72 in the sixth embodiment. This combination allows the solvent heated in the liquid end tank 23 to be fed to the nozzle 13 while preventing lowering of the solvent temperature by means of the ribbon heater 72.

In addition, the apparatus structures in the fifth to seventh embodiments and the cleaning of the filter unit 3 in the first to fourth embodiments can be combined with each other. For example, after the organic matters have been discharged from the inside of the resist liquid supply passage 1 by supplying the heated solvent from the liquid end tank to the resist liquid supply passage 1, a solvent capable of dissolving the resin in the filter unit 3 that may cause particles may be supplied to the resist liquid supply passage 1 so as to clean the filter unit 3. In addition, a heating unit such as the heat-generating cover member 41 in the first embodiment may be attached to the filter unit 3 to heat the solvent by the heating unit so as to clean the resist liquid supply passage 1 and the filter unit 3.

In the fifth to seventh embodiments, the treatment liquid supply apparatus is the resist liquid supply apparatus. However, like the first embodiment, for example, the treatment liquid supply apparatus may be the solvent supply apparatus for pre-wetting the surface of a wafer W before a resist liquid is supplied to the wafer W. In this case, the solvent supply passage on the downstream side of the supply source (solvent tank) 21 of the solvent for treatment that supplies a pre-wetting solvent as a treatment liquid may adopt the structures described in the fifth to seventh embodiments, and may also employ the same pretreatment method as those described in the fifth to seventh embodiments. In addition, the piping extending from the solvent supply source for supplying a heated solvent that is exclusively used for cleaning may be merged with the processing solvent supply passage 1 on the downstream side of the solvent supply source (solvent tank 21) for treatment (see FIG. 1). In this case, when the solvent supply passage 1 (treatment liquid supply passage) is subjected to the cleaning process, the connecting destination of the solvent supply passage 1 is switched from the solvent supply source 21 for treatment to the solvent supply source for cleaning through the switching of the valves, for example.

Examples

Evaluation tests for evaluating the present invention and comparative tests for confirming the effect of the present invention are described below.

A. Evaluation Test for Evaluating Relationship Between Staying of Solvent after Passage of Solvent Through Filter and Number of Particles (Evaluation Test A)

A new filter unit was installed in a liquid treatment apparatus having a structure equivalent to the solvent supply apparatus (1) in the aforementioned first embodiment but without including the heat-generating cover member (41), and the following test was conducted. On the first day, 1 gallon (about 3.8 liters) of thinner (OK73 thinner, Resisted trademark, Manufactured by Tokyo Ohka Kogyo Co., Ltd.) at 23° C. was introduced into the solvent supply apparatus, and removed bubbles therefrom (see the aforementioned wetting process). Following thereto, 0.5 L (liters) of the solvent supplied from the solvent bottle (21) was passed through the solvent supply passage (1) (this 0.5 L of liquid was discarded from the nozzle (13) by a dummy dispensing operation), and then 3 mL of the solvent was ejected from the nozzle (13) so as to be supplied to a central portion of a rotating wafer W. After that, the number of particles remaining on the wafer W was counted. Then, similarly to the above, 0.5 L of the solvent (1 L in integrated amount) supplied from the solvent bottle (21) was passed through the solvent supply passage, and 3 mL of the solvent was supplied to a wafer W, similarly to the above. Then, the number of particles remaining on the wafer W was counted. Thereafter, each time after 1.5 L of the solvent, 4.0 L of the solvent, and 8.0 L of the solvent each in integrated amount was passed through the solvent supply passage (1), 3 mL of the solvent was supplied to wafers W, and the number of particles remaining on each wafer W was counted. After the aforementioned series of testing steps were conducted on the first day, the solvent supply apparatus was left as it was with the solvent staying in the solvent supply passage (1).

On the second day, 1 gallon of new solvent was introduced into the solvent supply passage (1) to purge the inside of the solvent supply passage was purged. Then, 3 mL of the solvent was ejected from the nozzle (13) toward the wafer W, and the number of particles remaining on the wafer W was counted. After that, the solvent supply apparatus was left as it was with the solvent staying in the filter unit (3) for 1 hour. Then, 3 mL of the solvent was ejected to a central portion of a rotating wafer W, and the number of particles remaining on the wafer W was counted.

After the aforementioned testing steps were conducted on the second day, the solvent supply apparatus was left as it was with the solvent staying in the solvent supply passage (1). Further, the same testing steps as those conducted on the second day were conducted on the third day, 30th day, 75th day and 150th day, respectively. In this test and other tests, only particles having a diameter of 28 nm or more were counted.

Figure 16:
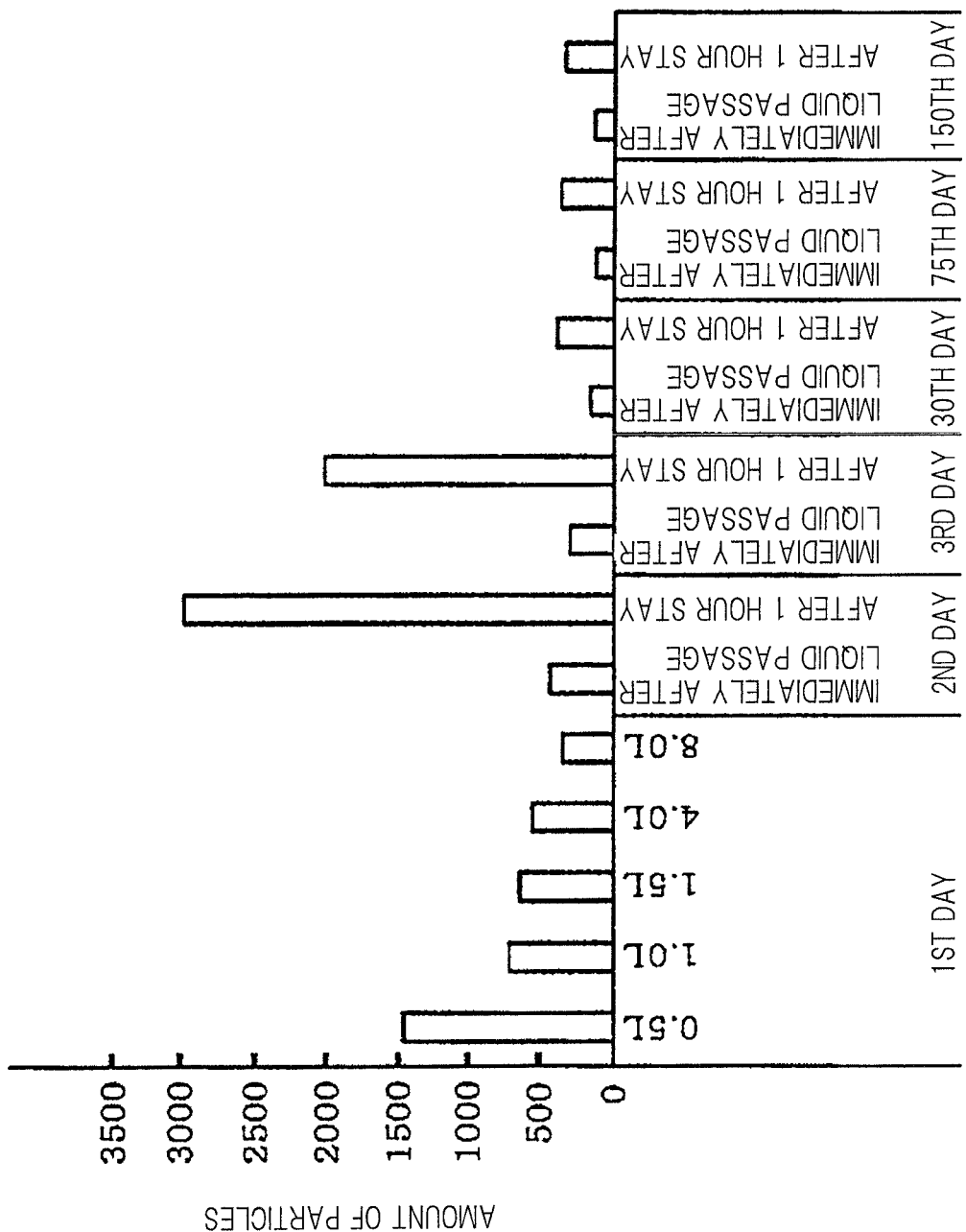
FIG. 16 is a graph showing a result of an evaluation test.

FIG. 16 is a graph showing the result of Evaluation Test A. From the result shown in the graph, it could be confirmed that the number of particles in the thinner after it stayed in the apparatus increased on the third day, 30th day, 75th day and 150th day. The increasing rate of the number of particles after stay (after staying for one hour/immediately after passage of thinner) was the greatest on the second day. Even after the elapse of a few months from the installation of the new filter unit in the apparatus, the phenomenon that the number of particles increased after staying was observed.

B. Evaluation Test 1 for Evaluating Relationship Between Filter Part Pretreatment and Number of Particles (Evaluation Test B)

A test for evaluating an advantage of the pretreatment according to the aforementioned second embodiment was conducted. A filter unit (3) was subjected to the pretreatment at 60° C. in accordance with the same procedure as described in the second embodiment, with the use of a pretreatment apparatus (5) which is essentially the same as the pretreatment apparatus in the second embodiment shown in FIG. 6. The pretreated filter unit (3) was attached to the solvent supply passage of the solvent supply apparatus. 2 gallons of thinner, which was the same as the thinner used in the Evaluation Test A, was passed through the solvent supply passage (1) so as to purge the inside of the solvent supply passage (1). Immediately thereafter, 3 mL of thinner was ejected to a rotating wafer W, and the number of particles remaining on the wafer W was counted. After that, the solvent supply apparatus was left as it was with the thinner staying in the solvent supply passage (1) for 1 hour. Then, 3 ML of thinner was ejected to the rotating wafer W and the number of particles remaining on the wafer W was counted. After the above testing step had been conducted, the solvent supply apparatus was left as it was with the thinner staying in the solvent supply passage (1). On the second day, 1 gallon of new solvent was introduced into the solvent supply passage (1) to purge the inside of the solvent supply passage. After that, 3 mL of solvent was ejected from the nozzle (13) to the wafer W, and the number of particles remaining on the wafer W was counted. Thereafter, the solvent supply apparatus was left as it was with the thinner staying in the solvent supply passage (1) for 1 hour. Thereafter, 3 mL of thinner was ejected to the rotating wafer W, and the number of particles remaining on the wafer W was counted. On the third day and the seventh day, the ejection of the thinner and the counting of the number of particles were performed in accordance with the same procedure as that of the second day. Further, as a comparative example, a filter unit (3) without being subjected to the pretreatment was attached to the solvent supply passage (1) of the solvent supply apparatus, and the ejection of the thinner to the wafer W and the counting of the number of particles were performed in accordance with the same procedure as described above. The test in comparative example was conducted only on the first day.

FIG. 17 is a graph showing the result of the Evaluation Test B. As a control, the result of the filter unit without being subjected to the pretreatment is shown in the left end. From the result shown in the graph, as compared with the filter unit without being subjected to the pretreatment, it is apparent that, in the filter unit subjected to the pretreatment, increase in the number of particles after the thinner stayed in the apparatus was restrained. In addition, on the third day and the seventh day, small increase in the number of particles after staying was observed. The reason for the increase in the number of particles is considered that the degree of soaking of the whole filter unit to the thinner is increased as compared with the first day and the second day, whereby the substance causing particles was eluted into the thinner from a part that had not been soaked with the thinner.

C. Evaluation Test 2 for Evaluating Relationship Between Filter Part Pretreatment and Number of Particles (Evaluation Test C)

A test for evaluating the effect of warming in the pretreatment was conducted to a filter unit having a filter part made of UPE and a filter unit having a filter part made of nylon, with the use of a pretreatment apparatus that is substantially the same as the pretreatment apparatus 5. To be specific, a plurality of filters of the same lot were prepared for each filter type, and the filters were divided into two groups. The filters in one of the groups were subjected to the pretreatment with warming, similarly to the Evaluation Test B. As a control, the filters in the other group were subjected to the pretreatment without warming. Similar to the Evaluation Test B, 2 gallons of thinner, which was the same thinner as that used in the Evaluation Test A, was passed through the solvent supply passage (1) so as to purge the inside of the solvent supply passage (1). Immediately thereafter, 3 mL of thinner was ejected to a rotating wafer W, and the number of particles remaining on the wafer W was counted. After that, the pretreatment apparatus was left as it was with the thinner staying in the solvent supply passage (1) for 16 hours. Thereafter, 3 mL of thinner was ejected to a rotating wafer W, and the number of particles remaining on the wafer W was counted.

Figure 18:
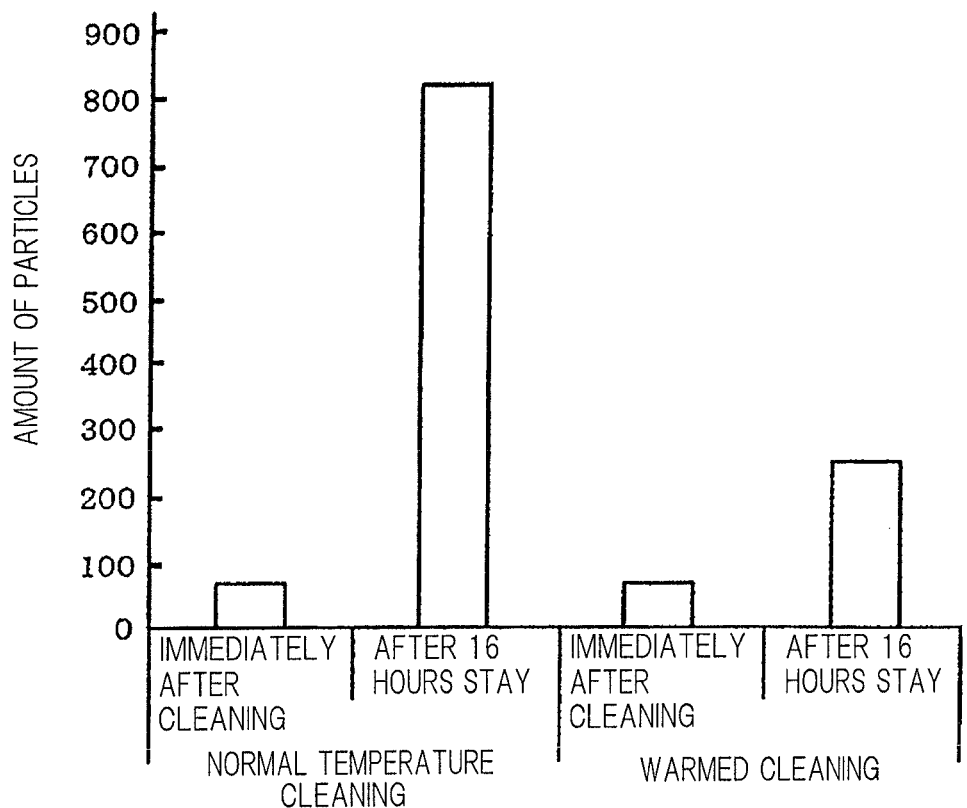
FIG. 18 is a graph showing a result of an evaluation test.
Figure 19:
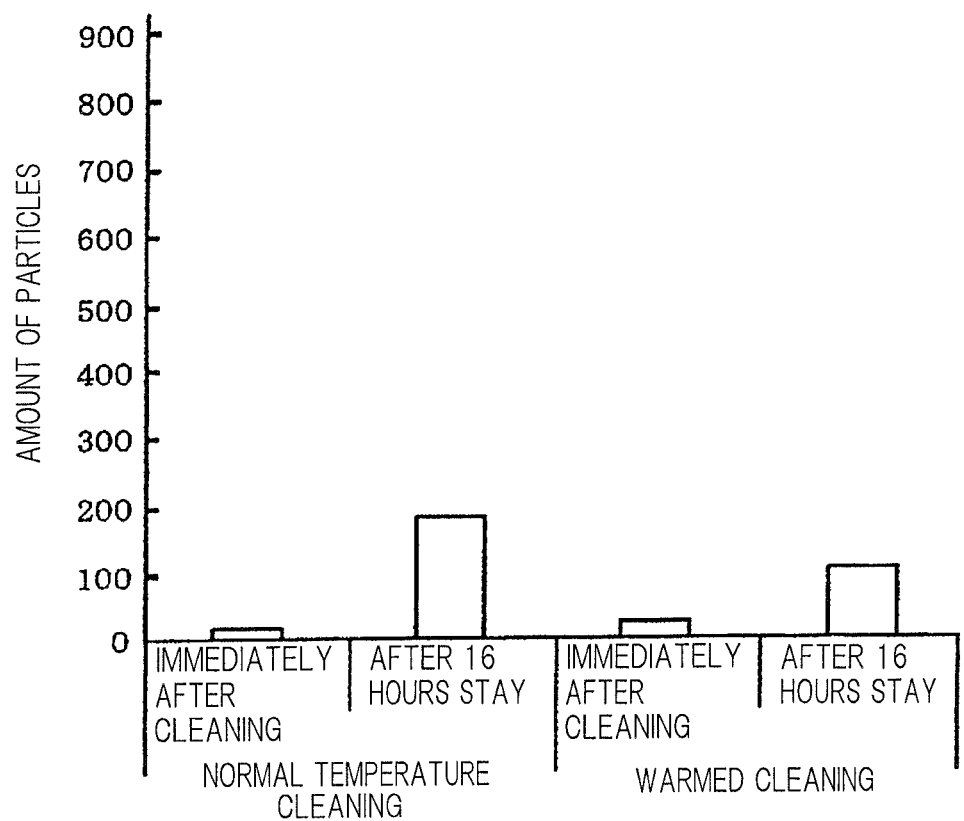
FIG. 19 is a graph showing a result of an evaluation test.

FIGS. 18 and 19 show the result of Evaluation Test C. The results of the pretreatment with warming are shown on the right side, and the results of the pretreatment without warming as a control are shown on the left side. FIG. 18 shows the number of particles discharged from the filter unit having the filter part made of UPE, and FIG. 19 shows the number of particles discharged from the filter unit having the filter part made of nylon. From the graphs, it could be confirmed that, due to the warming during the pretreatment, the increase in the number of particles after the thinner stayed could be restrained, as compared with the pretreatment without warming. A significant difference between the numbers of particles shown in FIGS. 18 and 19 could be confirmed by a dispersion analysis. Thus, it can be said that the pretreatment to the filter unit of the present invention can restrain a phenomenon that the number of particles increases by the stay of the thinner in the filter unit.

The invention claimed is:

1. A method of pretreating a treatment liquid supply passage to eliminate foreign matters of organic matters that may be included in a solvent-containing treatment liquid for performing liquid treatment to a treatment object, wherein the treatment liquid supply passage is configured to feed the solvent-containing treatment liquid from a treatment liquid supply source to a nozzle for discharging the solvent-containing treatment liquid to the treatment object, and a return passage connects a first point and a second point of the treatment liquid supply passage, said pretreatment method comprising:
supplying a solvent for pretreatment to the treatment liquid supply passage;
thereafter discharging the solvent for pretreatment from the treatment liquid supply passage, and
circulating, at least once, the solvent for pretreatment through a circulation passage comprising the return passage and a portion of the treatment liquid supply passage between the first and second points,
wherein the solvent for pretreatment is a heated solvent,
wherein a solubility of the organic matters to the solvent for pretreatment is greater than the solubility of the organic matters to the solvent contained in the treatment liquid, and
wherein said method removes the organic matters adhering to a liquid-contacting surface of the treatment liquid supply passage.

2. The pretreatment method of pretreating the treatment liquid supply passage according to claim 1, wherein
a controller is configured to supply the solvent for pretreatment into the treatment liquid supply passage includes replacing the solvent for pretreatment present in the treatment liquid supply passage with a new solvent for pretreatment.

3. The pretreatment method of pretreating the treatment liquid supply passage according to claim 1, wherein
a controller is configured to heat the solvent for pretreatment.

4. The method of claim 1, wherein the solvent for pretreatment is discharged from the treatment liquid supply passage through the nozzle.

5. A treatment liquid supply apparatus that supplies a treatment object with a solvent-containing treatment liquid for performing liquid treatment to the treatment object, said apparatus comprising:
a treatment liquid supply passage having one end to which a treatment liquid ejecting unit for ejecting the treatment liquid to the treatment object is provided, and having the other end to which a treatment liquid supply source is to be connected;
a pretreatment mechanism that supplies a solvent for pretreatment to an inside of the treatment liquid supply passage;
wherein a solubility of organic matters to the solvent for pretreatment is greater than a solubility of the organic matters to the solvent contained in the treatment liquid
wherein the treatment liquid supply passage is configured to feed the solvent- containing treatment liquid from a treatment liquid supply source to a nozzle for discharging the solvent-containing treatment liquid to the treatment object, and a return passage connects a first point and a second point of the treatment liquid supply passage,
wherein the solvent for pretreatment is circulated, at least once, for pretreatment through a circulation passage comprising the return passage and a portion of the treatment liquid supply passage between the first and second points, wherein the solvent for pretreatment is a heated solvent, and wherein the solvent for pretreatment removes the organic matters adhering to a liquid-contacting surface of the treatment liquid supply passage.

6. The treatment liquid supply apparatus according to claim 5, wherein the pretreatment mechanism includes a heating mechanism for heating the treatment liquid supply passage.

7. The treatment liquid supply apparatus according to claim 5, wherein the pretreatment mechanism includes a solvent supply mechanism that supplies the heated solvent to the inside of the treatment liquid supply passage.

* * * * *